United States Patent
Nakatani et al.

(10) Patent No.: US 7,342,442 B2
(45) Date of Patent: Mar. 11, 2008

(54) VARIABLE GAIN AMPLIFYING APPARATUS AND WIRELESS COMMUNICATION APPARATUS

(75) Inventors: Toshifumi Nakatani, Izumi (JP); Jyunji Itoh, Hirakata (JP); Hideo Nakano, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/391,623

(22) Filed: Mar. 28, 2006

(65) Prior Publication Data

US 2006/0176112 A1   Aug. 10, 2006

Related U.S. Application Data

(63) Continuation of application No. 10/263,252, filed on Oct. 2, 2002, now abandoned.

(30) Foreign Application Priority Data

Oct. 5, 2001   (JP)   ............... 2001-310568

(51) Int. Cl.
*H03F 1/14*   (2006.01)
*H03F 1/00*   (2006.01)

(52) U.S. Cl. .................. 330/51; 330/151; 328/306; 328/560

(58) Field of Classification Search .............. 330/51, 330/124 R, 151, 297, 295; 327/306, 560; 455/127.2, 127.3; 375/258, 264, 279, 345; 333/138
See application file for complete search history.

(56) References Cited

U.S. PATENT DOCUMENTS 3,544,924 A * 12/1970 Fjallbrant ................ 333/138

5,008,631 A   4/1991 Scherer et al.
5,862,461 A   1/1999 Yoshizawa et al.

(Continued)

FOREIGN PATENT DOCUMENTS

EP   1 001 529   5/2000

(Continued)

OTHER PUBLICATIONS

European Search Report for EP 02 02 2304, dated Apr. 4, 2005.

(Continued)

*Primary Examiner*—David Nelms
*Assistant Examiner*—David Y. Chung
(74) *Attorney, Agent, or Firm*—RatnerPrestia

(57) ABSTRACT

A variable gain amplifying apparatus has an amplifier, one or more first switching elements connected in parallel to the amplifier, and a phase shifter connected in series to the first switching element. The first switching element is enabled if the level of an input signal or an output signal is higher than a predetermined level, and the first switching element is disabled if the level of the input signal or the output signal is equal to or lower than the predetermined level. The amplifier does not operate when the first switching element is enabled, and the amplifier operates when the first switching element is disabled, and the amount of phase shift when the input signal is passed through the amplifier and phase shifter is substantially equal to the amount of phase shift when the input signal is passed through the first switching element.

13 Claims, 29 Drawing Sheets

U.S. PATENT DOCUMENTS

| | | |
|---|---|---|
| 6,070,063 A | 5/2000 | Yoshizawa et al. |
| 6,104,246 A | 8/2000 | LaFerrara et al. |
| 6,137,354 A | 10/2000 | Dacus et al. |
| 6,591,087 B1 | 7/2003 | Oda |

FOREIGN PATENT DOCUMENTS

| JP | 63-156431 | 6/1988 |
|---|---|---|
| JP | 08-288879 | 11/1996 |
| JP | 9-130275 | 5/1997 |
| JP | 2001-111450 | 4/2001 |

OTHER PUBLICATIONS

European Search Report for Application No. EP 02 02 2304, dated Aug. 8, 2006.

* cited by examiner

34

42

SIGNALS ARE SYNCHRONIZED

SIGNALS ARE NOT SYNCHRONIZED

VARIABLE GAIN AMPLIFYING APPARATUS AND WIRELESS COMMUNICATION APPARATUS

This application is a continuation of U.S. patent application Ser. No. 10/263,252, filed Oct. 2, 2002, now abandoned the contents of which are incorporated herein by reference.

BACKGROUND OF THE INVENTION

1. Field of the Invention

The present invention relates to a variable gain amplifying apparatus having a gain control function, and a wireless communication apparatus.

2. Related Art of the Invention

A pre-stage amplifier of a reception device in a radio system represented by cellular phones needs to have low-noise and high-gain characteristics if receiving very weak signals, and the pre-amplifier needs to have low-distortion and low-gain characteristics if receiving large signals.

Particularly, in current mobile communications, since the electric field intensity during reception varies significantly depending on the distance between a base station and a mobile station, the reception device requires a large dynamic range, and consequently the pre-amplifier of the reception device needs to have a gain control function.

FIG. 21 shows the circuit configuration of main parts of a cellular phone terminal in which a conventional variable gain amplifying apparatus having this gain control function is used. The cellular phone terminal of FIG. 21 is used in digital radio communications using modulation systems such as QPSK.

In FIG. 21, the cellular phone terminal is comprised of an antenna 1, a duplexer 2, a transmission circuit portion 3, a variable gain amplifying apparatus 4, a mixer 7, a filter 8, mixers 9, 10, a local oscillator 11 and a phase shifter 12. The variable gain amplifying apparatus 4, the mixer 7, the filter 8, the mixers 9, 10, the local oscillator 11 and the phase shifter 12 constitute a reception circuit portion. The mixer 9, the mixer 10, the local oscillator 11 and the phase shifter 12 constitute an orthogonal demodulator.

The antenna 1 sends a send signal as a send wave, and receives a receive wave as a receive signal. The duplexer 2 guides the send signal outputted from the transmission circuit 3 to the antenna 1, and guides the receive wave received at the antenna 1 to the variable gain amplifying apparatus 4. The variable gain amplifying apparatus 4 is a circuit that amplifies the receive signal as the pre-amplifier of the reception circuit portion. The mixer 7 is a circuit that combines the signal inputted from an oscillator (not shown) with the receive signal amplified by the variable gain amplifying apparatus 4, thereby converting the amplified signal into an intermediate frequency signal. The filter 8 is a circuit that weakens unnecessary frequency components of the signal converted into the intermediate frequency signal. The mixer 10 is a circuit that combines together the signal outputted from the filter 8 and the signal inputted from the local oscillator 11, thereby demodulating a baseband I signal. The mixer 9 is a circuit that combines together the signal outputted from the filter 8 and the signal with its phase shifted by an angle of 90 degrees by the phase shifter 12, thereby demodulating a base band Q signal. The phase shifter 12 is a circuit that shifts the phase of the signal oscillated by the local oscillator 11 by an angle of 90 degrees.

The variable gain amplifying apparatus 4 is comprised of an amplifier 5 and a switching element 6.

The operation of this conventional cellular phone terminal will now be described.

The receive signal received at the antenna 1 is amplified by the variable gain amplifying apparatus 4 via the duplexer 2. The mixer 7 converts the receive signal amplified by the variable gain amplifying apparatus 4 into the intermediate frequency signal, and the filter 8 weakens unnecessary frequency components of the converted intermediate frequency signal.

On the other hand, the signal from the local oscillator 11 is outputted to the mixer 10 and the phase shifter 12. The mixer 10 combines together the output signal from the filter 8 and the signal inputted from the local oscillator 11, thereby demodulating the base band I signal.

The phase shifter 12 outputs to the mixer 9 the signal with its phase shifted by an angle of 90 degrees coming from the local oscillator 11, and the mixer 9 combines together the output signal from the filter 8 and the signal from the phase shifter 12, thereby demodulating the base band Q signal.

The demodulated base band I signal and base band Q signal are inputted to a base band portion (not shown), where they are restored to digital voice data.

If the cellular phone terminal exists within close range of the base station, and so on, the magnitude of the receive signal received at the antenna 1 is large. In this case, a large receive signal is inputted to the variable gain amplifying apparatus 4 as well. In this case, the supply to the variable gain amplifying apparatus 4 of a power voltage for operating the amplifier 5 is stopped, and the switching element 6 is controlled so that it becomes enabled. Therefore, the large receive signal inputted from the duplexer 2 is outputted to the mixer 7 through the switching element 6 without being amplified by the amplifier 5. That is, the variable gain amplifying apparatus 4 operates in a low gain mode. In this way, the variable gain amplifying apparatus 4 operates in a low gain mode when the magnitude of the receive signal is large.

On the other hand, if the cellular phone terminal exists at a great distance from the base station, and so on, the intensity of the receive signal received at the antenna 1 is very low. In this case, a very weak signal is inputted to the variable gain amplifying apparatus 4 as well. In this case, the variable gain amplifying apparatus 4 is supplied with a power voltage for operating the amplifier 5, and the switching element 6 is controlled so that it becomes disabled. Therefore, the very weak receive signal inputted from the duplexer 2 is amplified by the amplifier 5 and then outputted to the mixer 7 without passing through the switching element 6. That is, the variable gain amplifying apparatus 4 operates in a high gain mode. In this way, the variable gain amplifying apparatus 4 operates in a high gain mode when the intensity of the receive signal is very low.

In this way, the variable gain amplifying apparatus 4 operates in a low gain mode when the magnitude of the receive signal is large, and operates in a high gain mode when the intensity of the receive signal is very low, and therefore the variable gain amplifying apparatus 4 can have a wide dynamic range.

However, the inventor has found that the amount of phase shift of the receive signal passed through the variable gain amplifying apparatus 4 when the variable gain amplifying apparatus 4 operates in a low gain mode is different from the amount of phase shift of the receive signal passed through the variable gain amplifying apparatus 4 when the variable gain amplifying apparatus 4 operates in a high gain mode.

Therefore, when the variable gain amplifying apparatus 4 is switched from the low gain mode to the high gain mode, or switched from the high gain mode to the low gain mode, the phase of the signal outputted from the variable gain amplifying apparatus 4 is shifted in a discontinuous manner, thus making it impossible to provide synchronization in the orthogonal demodulator constituted by the mixer 9, the mixer 10, the local oscillator 11 and the phase shifter 12. Therefore, the base band I signal and the base band Q signal cannot be demodulated normally in the orthogonal demodulator until synchronization can be provided.

The above situation will be described more specifically. First, the situation in which the orthogonal demodulator demodulates normally the base band I signal and the base band Q signal will be described.

Assume that the input signal to an orthogonal modulator is expressed by the following equation 1.

$$S(t)=I(t)\cdot\cos \omega t+Q(t)\sin \omega t \quad \text{[Equation 1]}$$

wherein I(t) represents a digital signal taking on a value of +1 or −1, and Q(t) represents a digital signal taking on a value of +1 or −1.

In this case, the local oscillator 11 can be synchronized with the input signal S(t) to the orthogonal modulator, and therefore the local oscillator 11 outputs a signal oscillating at cos ωt to the mixer 10. Therefore, in the mixer 10, the signal outputted from the local oscillator 11 and the input signal to the orthogonal demodulator are combined together, and thus the output signal from the mixer 10 is expressed by the following equation 2.

$$S(t)\cdot\cos \omega t=I(t)\cdot(1/2)\cdot(\cos 2\omega t+1)+Q(t)\cdot(1/2)\cdot\sin 2\omega t \quad \text{[Equation 2]}$$

This output signal is passed through a low pass filter (not shown in FIG. 21), whereby the baseband I signal expressed by the following equation 3 is demodulated.

$$(1/2)\cdot I(t) \quad \text{[Equation 3]}$$

On the other hand, the output signal cos ωt from the local oscillator 11 is inputted to a phase shifter 12, and the phase shifter 12 shifts the phase by an angle of 90 degrees, thereby outputting the signal of sin ωt to the mixer 9. In the mixer 9, the signal outputted from the phase shifter 12 and the input signal to the orthogonal demodulator are combined together, and thus the output signal from the mixer 9 is expressed by the following equation 4.

$$S(t)\cdot\sin \omega t=I(t)\cdot(1/2)\cdot\sin 2\omega t+Q(t)\cdot(1/2)\cdot(1-\cos 2\omega t) \quad \text{[Equation 4]}$$

This output signal is passed through a low pass filter (not shown in FIG. 21), whereby the base band Q signal expressed by the following equation 5 is demodulated.

$$(1/2)\cdot Q(t) \quad \text{[Equation 5]}$$

In this way, in the case where the input signal S(t) from the orthogonal demodulator can be synchronized with the signal oscillated by the local oscillator 11, the base band I signal and the base band Q signal can be demodulated normally by the orthogonal demodulator.

Examples of values of the demodulated base band I signal and base band Q signal expressed by the equations 3 and 5, respectively, are shown in FIG. 22(A). That is, in FIG. 22(B), the values of I(t) and Q(t) are identical to each other, and change with time from +1 to −1 to +1 ... FIG. 22(B) shows a plot with the base band I signal on the horizontal axis and the base band Q signal on the vertical axis for given values of I(t) and Q(t). The pair of the base band I signal and base band Q signal shown in FIG. 22 (A) is plotted in the first and third quadrant in FIG. 22(B). When a straight line is drawn along the plotted spots, the line slants at an angle of 45° relative to the horizontal axis.

Here, assume that magnitude of the receive signal received at the antenna 1 is changed, and as a result, the variable gain amplifying apparatus 4 is switched from the low gain mode to the high gain mode, or switched from the high gain mode to the low gain mode. In this case, as described above, the amount of phase shift of the receive signal passed through the variable gain amplifying apparatus 4 when the variable gain amplifying apparatus 4 operates in the low gain mode is different from the amount of phase shift of the receive signal passed through the variable gain amplifying apparatus 4 when the variable gain amplifying apparatus 4 operates in the high gain mode. Therefore, the phase of the input signal S(t) to the orthogonal demodulator is shifted by φ.

Thus, the input signal S(t) to the orthogonal modulator is expressed by the following equation 6.

$$S(t)=I(t)\cdot\cos(\omega t+\phi)+Q(t)\sin(\omega t+\phi) \quad \text{[Equation 6]}$$

wherein I(t) represents a digital signal taking on a value of +1 or −1, and Q(t) represents a digital signal taking on a value of +1 or −1.

In this case, the local oscillator 11 outputs a signal oscillating at cos ωt to the mixer 10. Therefore, in the mixer 10, the signal outputted from the local oscillator 11 and the input signal to the orthogonal demodulator are combined together, and thus the output signal from the mixer 10 is expressed by the following equation 7.

$$S(t)\cdot\cos \omega t=I(t)\cdot(1/2)(\cos \phi+\cos 2\omega t)+Q(t)\cdot(1/2)\cdot(-\sin \phi+\sin 2\omega t) \quad \text{[Equation 7]}$$

This output signal is passed through a low pass filter (not shown in FIG. 21), whereby the base band I signal expressed by the following equation 8 is demodulated.

$$(1/2)\cdot(I(t)\cdot\cos \phi-Q(t)\cdot\sin \phi) \quad \text{[Equation 8]}$$

On the other hand, the output signal cos ωt from the local oscillator 11 is inputted to a phase shifter 12, and the phase shifter 12 shifts the phase by an angle of 90 degrees, thereby outputting the signal of sin ωt to the mixer 9. In the mixer 9, the signal outputted from the phase shifter 12 and the input signal to the orthogonal demodulator are combined together, and thus the output signal from the mixer 9 is expressed by the following equation 9.

$$S(t)\cdot\sin \omega t=I(t)\cdot(1/2)\cdot(\sin \phi+\sin 2\omega t)+Q(t)\cdot(1/2)\cdot(\cos \phi-\cos 2\omega t) \quad \text{[Equation 9]}$$

This output signal is passed through a low pass filter (not shown in FIG. 21), whereby the base band Q signal expressed by the following equation 10 is demodulated.

$$(1/2)\cdot(I(t)\cdot\sin \phi+Q(t)\cdot\cos \phi) \quad \text{[Equation 10]}$$

In this way, when the mode of the variable gain amplifying apparatus 4 is switched, and as a result, the phase of the input signal S(t) to the orthogonal modulator is shifted, the demodulated base band I signal and base band Q signal are changed to those shown in FIG. 23. Namely, the situation shown in FIG. 22(A) is changed to that shown in FIG. 23(A), and the associated plot shown in FIG. 22(B) is changed to that shown in FIG. 23(B). Specifically, the pair of the baseband I signal and base band Q signal shown in FIG. 23(A) is plotted in the first and third quadrants in FIG. 23(B), but when a straight line is drawn along the plotted spots, the line slants at an angle larger than 45° relative to the horizontal axis.

In this way, provided that the pair of values of the demodulated base band I signal and base band Q signal is expressed by (1, 1) in FIG. 22(A), the pair of values may be shifted to the second quadrant when the mode of the variable gain amplifying apparatus 4 is switched. In some cases, the pair of values may be shifted to the third quadrant.

In this way, when the mode of the variable gain amplifying apparatus 4 is switched, the base band I signal and base band Q signal can be demodulated normally until the local oscillator 11 is synchronized with the input signal to the orthogonal demodulator after the mode of the variable gain amplifying apparatus 4 is switched, and therefore the voice digital signal can be restored normally, which may cause disconnection of received voices of the cellular phone terminal and occurrence of noises.

That is, there is a problem such that the phase of the signal outputted from the variable gain amplifying apparatus is shifted in a discontinuous manner when the gain of the variable gain amplifying apparatus is switched.

SUMMARY OF THE INVENTION

In view of the above problem, the object of the present invention is to provide a variable gain amplifying apparatus capable of sufficiently alleviating the situation in which the phase outputted from the variable gain amplifying apparatus is shifted in a discontinuous manner even when the gain of the variable gain amplifying apparatus is switched, and a wireless communication apparatus.

One aspect of the present invention is a variable gain amplifying apparatus comprising:

an amplifier;

one or more first switching elements connected in parallel to said amplifier; and a phase shifter connected in series to said first switching element, wherein said first switching element is enabled if the level of an input signal or an output signal is higher than a predetermined level, and said first switching element is disabled if the level of said input signal or said output signal is equal to or lower than said predetermined level, said amplifier does not operate when said first switching element is enabled, and said amplifier operates when said first switching element is disabled, and the amount of phase shift when said input signal is passed through said amplifier and phase shifter is substantially equal to the amount of phase shift when said input signal is passed through said first switching element.

Another aspect of the present invention is a variable gain amplifying apparatus comprising:

an amplifier;

one or more first switching elements connected in parallel to said amplifier;

a phase shifter connected in series to said first switching element;

one or more second switching elements connected in parallel to said amplifier; and a feedback circuit connected in series to said second switching element, wherein said first switching element is enabled if the level of an input signal or an output signal is higher than a predetermined level, and said first switching element is disable if the level of said input signal or said output signal is equal to or lower than said predetermined level, said amplifier does not operate when said first switching element is enabled, and said amplifier operates when said first switching element is disabled, said second switching element is disabled when said first switching element is enabled, said second switching element is enabled when said first switching element is disabled, and the amount of phase shift when said input signal is passed through said amplifier is substantially equal to the amount of phase shift when said input signal is passed through said first switching element and said phase shifter.

Still another aspect of the present invention is the variable gain amplifying apparatus wherein said first switching element is comprised of one or more third switching elements and one or more fourth switching elements, one end of said third switching element is connected to the input of said amplifier, the other end of said third switching element is connected to one end of said phase shifter, the other end of said phase shifter is connected to one end of said fourth switching element, and the other end of said fourth switching element is connected to the output of said amplifier.

Yet still another aspect of the present invention is the variable gain amplifying apparatus wherein said first switching element is comprised of one or more third switching elements and one or more fourth switching elements, one end of said third switching element is connected to the input of said amplifier, the other end of said third switching element is connected to one end of said phase shifter, the other end of said phase shifter is connected to one end of said fourth switching element, and the other end of said fourth switching element is connected to the output of said amplifier.

Still yet another aspect of the present invention is a variable gain amplifying apparatus comprising:

an amplifier;

one or more switching elements connected in parallel to said amplifier; and a phase shifter connected in series to said amplifier, wherein said switching element is enabled if the level of an input signal or an output signal is higher than a predetermined level, and said switching element is disable if the level of said input signal or said output signal is equal to or lower than said predetermined level, said amplifier does not operate when said switching element is enabled, and said amplifier operates when said switching element is disabled, and the amount of phase shift when said input signal is passed through said amplifier and phase shifter is substantially equal to the amount of phase shift when said input signal is passed through said first switching element.

A further aspect of the present invention is the variable gain amplifying apparatus wherein said phase shifter is comprised of one or more serial-connected capacitors and one or more parallel-connected resistors.

A still further aspect of the present invention is the variable gain amplifying apparatus wherein said phase shifter is comprised of one or more serial-connected resistors and one or more parallel-connected capacitors.

A yet further aspect of the present invention is the variable gain amplifying apparatus wherein said phase shifter is comprised of one or more strip lines, and said strip lines are connected so that a characteristic impedance monotonously increases or monotonously decreases.

A still yet further aspect of the present invention is the variable gain amplifying apparatus wherein said phase shifter is comprised of one or more parallel twin lines, and said parallel twin lines are connected so that a characteristic impedance monotonously increases or monotonously decreases.

An additional aspect of the present invention is the variable gain amplifying apparatus wherein said phase shifter is comprised of one or more serial-connected capacitors and one or more parallel-connected inductors.

A still additional aspect of the present invention is the variable gain amplifying apparatus wherein said phase shifter is comprised of one or more serial-connected inductors and one or more parallel-connected capacitors.

A yet additional aspect of the present invention is the variable gain amplifying apparatus wherein one end or both ends of said switching element are connected to the ground through the resistor or the inductor.

A still yet additional aspect of the present invention is a wireless communication apparatus comprising the variable gain amplifying apparatus and using phase modulation signals as send/receive signals.

A supplementary aspect of the present invention is a wireless communication apparatus comprising:

the variable gain amplifying apparatus;

a level detection circuit detecting the level of a receive signal in the rear of said variable gain amplifying apparatus; and a control circuit switching the gain of said variable gain amplifying apparatus, wherein said variable gain amplifying apparatus is switched to a low gain state if the level detected by said level detection circuit is higher than a predetermined level; and said variable gain amplifying apparatus is switched to a high gain state if the level detected by said level detection circuit is equal to or lower than said predetermined level.

A still supplementary aspect of the present invention is a wireless communication apparatus comprising:

the variable gain amplifying apparatus;

a channel selection filter;

a first level detection circuit detecting the level of a receive signal in the front stage of the channel selection filter;

a second level detection circuit detecting the level of a receive signal in the rear stage of the channel selection filter; and a control circuit switching the gain of said variable gain amplifying apparatus, wherein the output of said variable gain amplifying apparatus is inputted to said channel selection filter, said variable gain amplifying apparatus is switched to a low gain state if the level detected by said second level detection circuit is higher than a first predetermined level, said variable gain amplifying apparatus is switched to a high gain and low current state if the level detected by said second level detection circuit is equal to or lower than said first predetermined level, and the level detected by said first level detection circuit is equal to or lower than a second predetermined level, and said variable gain amplifying apparatus is switched to a high gain and high current state if the level detected by said second level detection circuit is equal to or lower than said first predetermined level, and the level detected by said first level detection circuit is equal to or lower than said second predetermined level.

DESCRIPTION OF SYMBOLS

Figure 1:
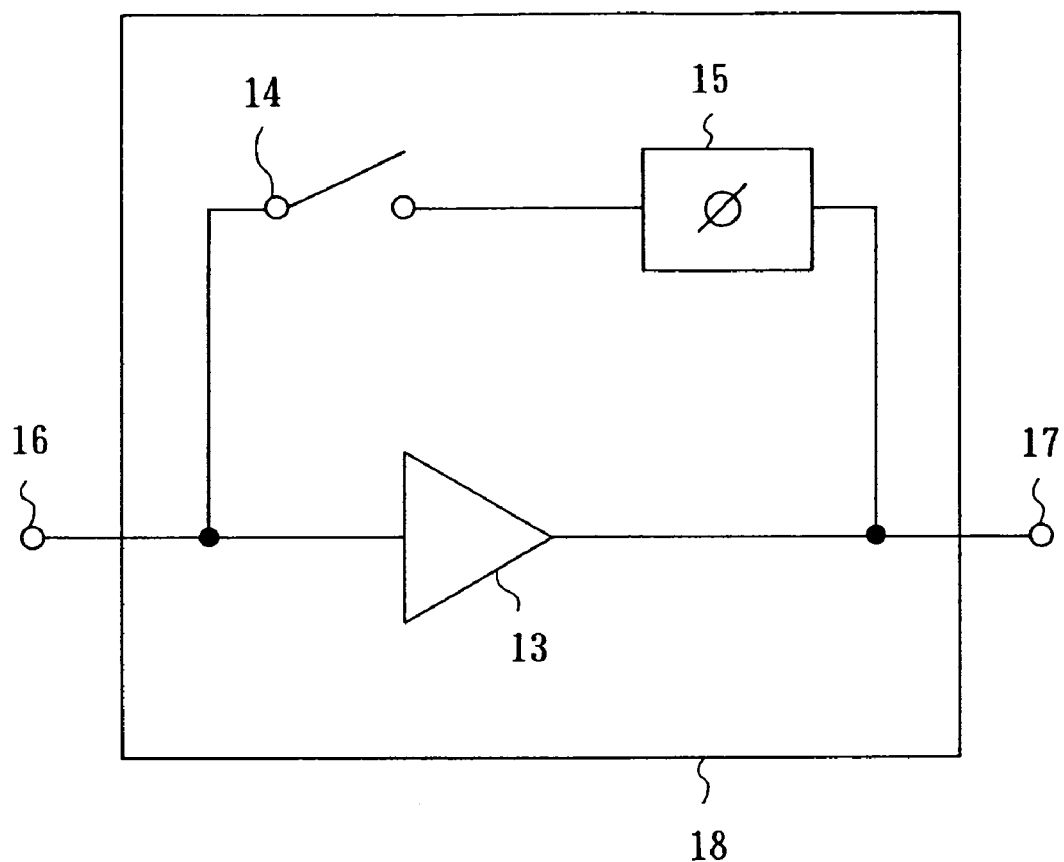
FIG. 1 shows the configuration of a variable gain amplifying apparatus in the first embodiment of the present invention.

13 Amplifier
14 Switching element
15 Phase shifter
16 Input terminal
17 Output terminal
18 Variable gain amplifying apparatus
19 Variable gain amplifying apparatus
20 Switching element
21 Variable gain amplifying apparatus
22 Feedback circuit
23 Switching element
24 Variable gain amplifying apparatus
25 Variable gain amplifying apparatus
30 Variable gain amplifying apparatus
31 Switching element power supply terminal
32 Variable gain amplifying apparatus
33 Variable gain amplifying apparatus
34 Variable gain amplifying apparatus
35 Variable gain amplifying apparatus
36 Variable gain amplifying apparatus
37 Variable gain amplifying apparatus
101, 101a, 101b Transistors
102, 102a, 102b Transistors
103, 103a, 103b Inductors
104, 104a, 104b Resistors
105, 105a, 105b Negative feedback side capacitors
106 Bypass capacitor
107 Bias power circuit
108 Bias power circuit
111, 112, 113 Resistors
114, 114a, 114b, 115, 115a, 115b, 116, 116a, 116b Capacitors
121, 121a, 121b, 122, 122a, 122b, 123, 123a, 123b Switching element
124, 124a, 124b Inverters
131, 131a, 131b Input side capacitors
132, 132a, 132b Choke coils
133, 133a, 133b Output side capacitors
311, 312, 313 Resistors
314, 315, 316 Capacitors
411, 412, 413 Capacitors
414, 415, 416 Resistors
511, 512, 513 Capacitors
514, 515, 516 Resistors
601 Semiconductor substrate
602 n-type well
603 p-type well
604 gate insulation film
605 Gate electrode
606 Drain layer
607 Source layer
608 Trench portion
609 Trench portion
610, 611, 612 Resistors
P3 Voltage control terminal
P10 Input node
P20 Output node
711, 712, 713 Strip lines
811, 812, 813 Strip lines
911a, 911b Lines
912a, 911b Lines
913a, 913b Lines
1011a, 1011b Lines
1012a, 1012b Lines
1013a, 1013b Lines

PREFERRED EMBODIMENTS OF THE INVENTION

Embodiments of the present invention will be described below referring to the drawings.

First Embodiment

First, the first embodiment will be described.

A variable gain amplifying apparatus 18 of this embodiment is shown in FIG. 1. The variable gain amplifying apparatus 18 is used as, for example, a variable gain amplifying apparatus 4 of a cellular phone terminal of FIG. 21.

The variable gain amplifying apparatus 18 is comprised of an amplifier 13, a switching element 14 and a phase shifter 15.

Figure 21:
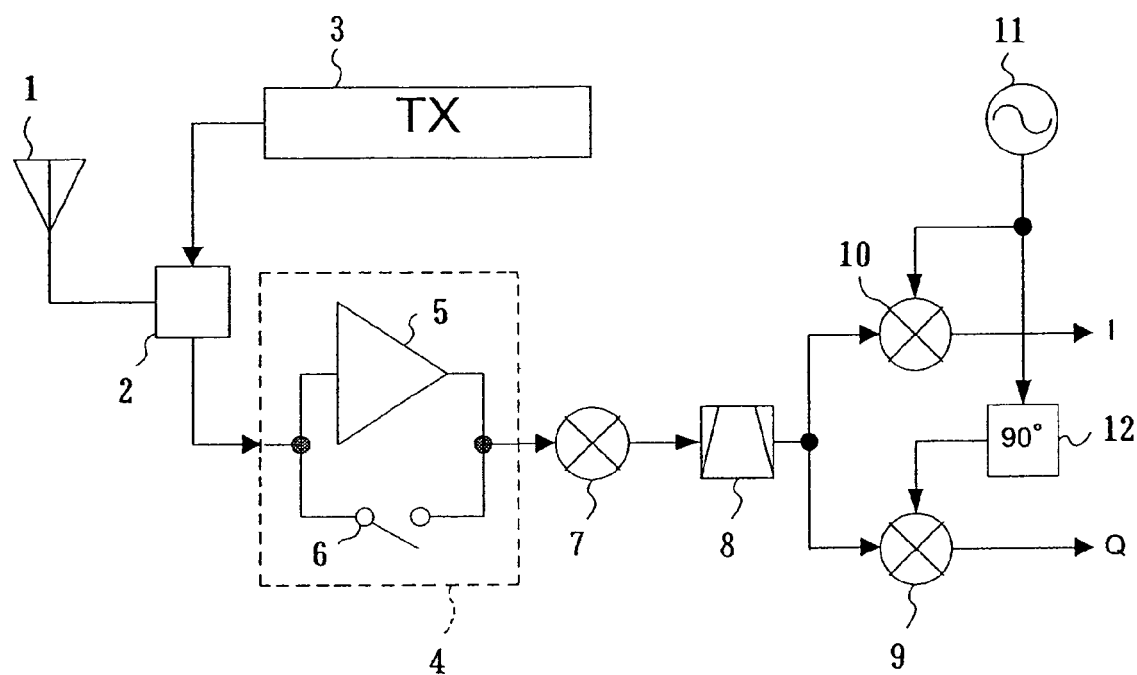
FIG. 21 shows the configuration of a cellular phone terminal using the variable gain amplifying apparatus.
Figure 22:
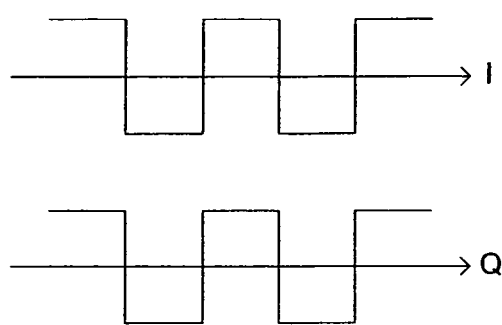
FIG. 22(A) shows plotted pairs of values of base band I signal and base band Q signal demodulated by an orthogonal demodulator when the signals are synchronized.
FIG. 22(B) shows the signal waveform of values of base band I signal and base band Q signal demodulated by the orthogonal demodulator when the signals are synchronized.
Figure 22:
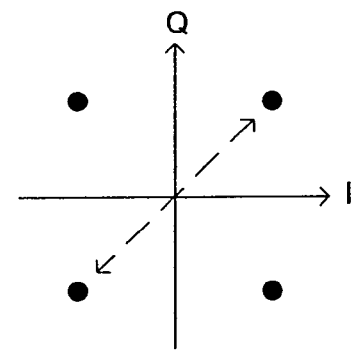
Figure 23:
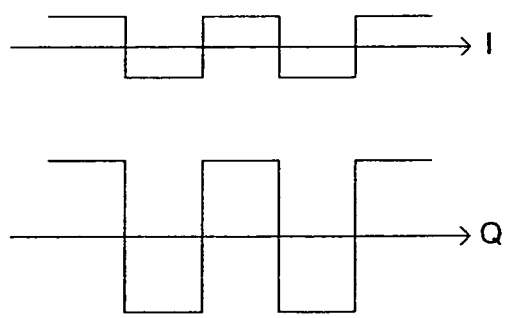
FIG. 23(A) shows plotted pairs of values of base band I signal and base band Q signal demodulated by an orthogonal demodulator when the signals are not synchronized.
FIG. 23(B) shows the signal waveform of values of base band I signal and base band Q signal demodulated by the orthogonal demodulator when the signals are not synchronized.
Figure 23:
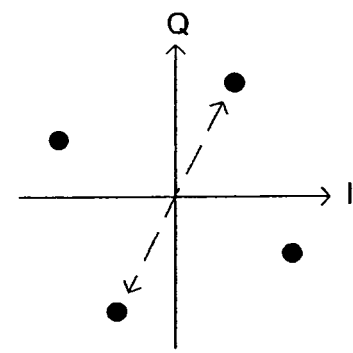

The amplifier 13 has its input connected to an input terminal 16 and its output connected to an output terminal 17. The switching element 14 is connected at one end to the input of the amplifier 13 and connected at the other end to one end of the phase shifter 15. The other end of the phase shifter 15 is connected to the output of the amplifier 13. The input terminal 16 is a terminal to which the receive signal outputted from the front stage of a duplexer 2 of FIG. 21 is inputted, and the output terminal 17 is a terminal for outputting the signal amplified in the variable gain amplifying apparatus 18 to the rear stage of a mixer 7 of FIG. 21 and the like.

In this way, the variable gain amplifying apparatus 18 of this embodiment has a configuration such that the switching element 14 is connected in parallel to the amplifier 13, and the phase shifter 15 is connected in series to the switching element 14.

The operation of this embodiment will now be described.

The variable gain amplifying apparatus 18 of this embodiment is operated by being controlled in accordance with a control circuit (not shown). The control circuit controls the operation of the variable gain amplifying apparatus 18 depending on the level of the receive signal received at the antenna 1.

That is, control is performed so that the switching element 14 is enabled if the level of the input signal is higher than a predetermined level, and the switching element 14 is disabled if the level of the input signal is equal to or lower than the predetermined level.

Also, control is performed so that the amplifier 13 does not operate when the switching element 14 is enabled, and the amplifier 13 operates when the switching element 14 is disabled. This control is performed by, for example, supplying a power voltage for operating the amplifier 13 when the amplifier 13 is to be operated, and stopping the supply of a power voltage for operating the amplifier 13 when the operation of the amplifier 13 is to be stopped.

Thus, the variable gain amplifying apparatus 13 operates in the low gain mode if the level of the receive signal is higher than a predetermined level. That is, since the switching element is enabled and the amplifier 13 stops its operation, the receive signal is inputted from the input terminal 16, passed through the switching element 14 and the phase shifter 15, and outputted from the output terminal 17.

On the other hand, the variable gain amplifying apparatus 18 operates in the high gain mode if the level of the receive signal is equal to or lower than the predetermined level. That is, since the switching element is disabled and the amplifier 13 operates, the receive signal is inputted from the input terminal 16, amplified by the amplifier 13, and outputted from the output terminal 17.

The phase shifter 15 shifts the phase of the receive signal inputted to the phase shifter 15 so that the amount of phase shift of the receive signal when the receive signal is passed through the amplifier is substantially equal to the amount of phase shift of the receive signal when the receive signal is passed through the switching element 14 and the phase shifter 15.

Therefore, even if the signal level of the receive signal is changed, and as a result, the variable gain amplifying apparatus 18 is switched from the high gain mode to the low gain mode, or switched from the low gain mode to the high gain mode, the phase of the signal outputted from the output terminal 17 is not shifted in a discontinuous manner.

That is, the phase of the input signal inputted to the orthogonal demodulator of FIG. 21 is not shifted in a discontinuous manner even if the mode of the variable gain amplifying apparatus 18 is switched, thus making it possible to prevent disconnection of received voices from the cellular phone terminal and occurrence of noises associated with the switching of the mode. Thus, by using the variable gain amplifying apparatus 18 of this embodiment in the pre-amplifier of the reception apparatus in the radio system represented by cellular phones, cellular phone terminals and the like with high quality of received voice can be provided.

Furthermore, in this embodiment, the switching element 14 is connected to the input of the amplifier 13, and the phase shifter 15 is connected to the output of the amplifier 13, but the invention is not limited to this configuration.

Figure 2:
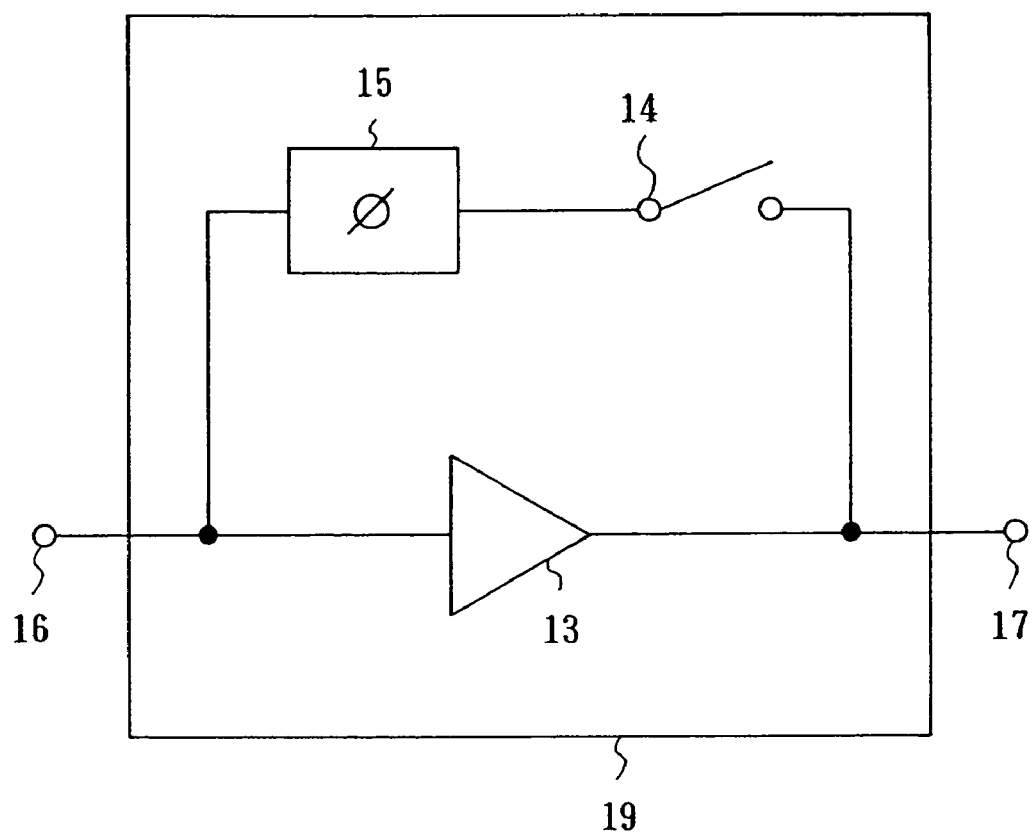
FIG. 2 shows another configuration of the variable gain amplifying apparatus in the first embodiment of the present invention.

A variable gain amplifying apparatus 19 having a configuration different from that of FIG. 1 is shown in FIG. 2. In the variable gain amplifying apparatus 19, the switching element 14 is connected to the output of the amplifier 13, and the phase shifter 15 is connected to the input of the amplifier 13. In the variable gain amplifying apparatus 19, the positions of the switching element 14 and the phase shifter 15 in the variable gain amplifying apparatus 18 are changed to each other. That is, one end of the phase shifter 15 is connected to the input of the amplifier 13, the other end of the phase shifter 15 is connected to one end of the switching element 14, and the other end of the switching element 14 is connected to the output of the amplifier 13. Use of the variable gain amplifying apparatus 19 makes it possible to attain a same degree of effectiveness as that described above.

Figure 3:
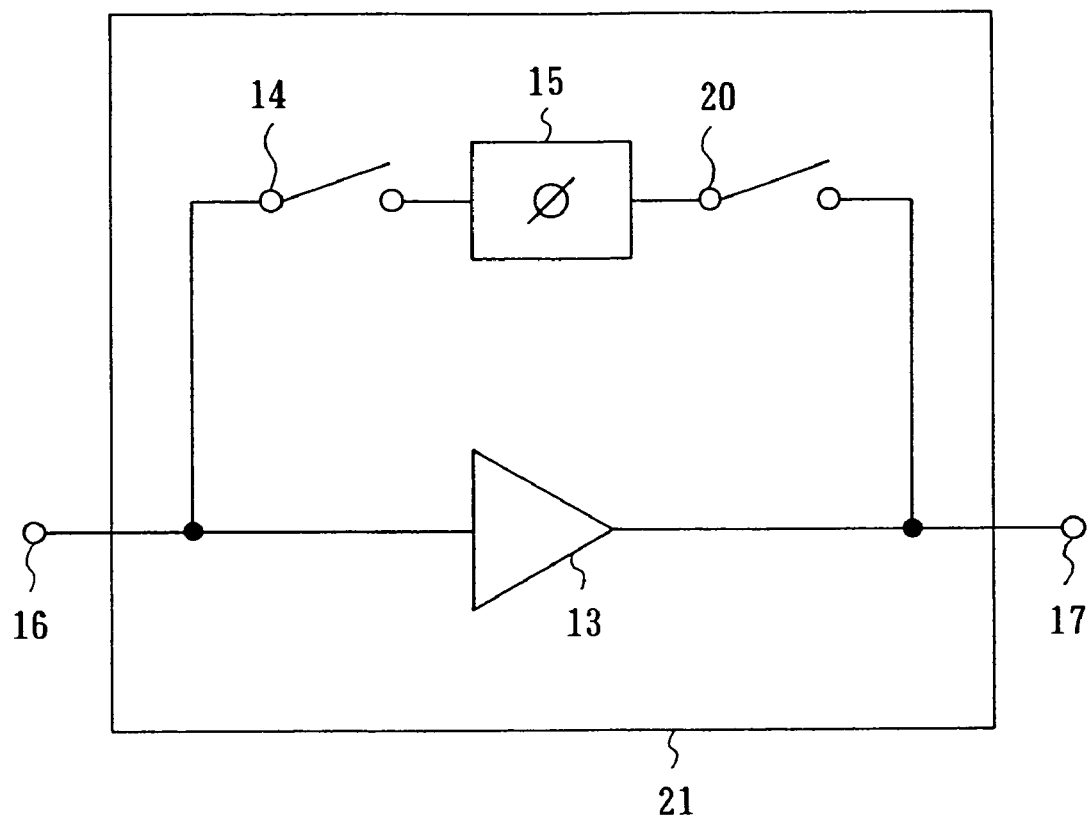
FIG. 3 shows another configuration of the variable gain amplifying apparatus in the first embodiment of the present invention.

A variable gain amplifying apparatus 21 having a configuration different from that of FIG. 1 is shown in FIG. 3. Unlike the variable gain amplifying apparatus 18 of FIG. 1, the variable gain amplifying apparatus 21 comprises two switching elements. Specifically, in the variable gain amplifying apparatus 21, one end of the switching element 14 is connected to the input of the amplifier 13, the other end of the switching element 14 is connected to the phase shifter 15, the other end of the phase shifter 15 is connected to one end of a switching element 20, and the other end of the switching element 20 is connected to the output of the amplifier 13.

The switching elements 14, 20 are enabled if the level of the receive signal inputted from the input terminal 16 is higher than a predetermined level, and the switching elements 14, 20 are disabled if the lever of the receive signal inputted from the input terminal 16 is equal to or lower than the predetermined level. The power voltage for operating the amplifier 13 is controlled as in the case of the above embodiment, so that the amplifier 13 does not operate when the switching elements 14 and 20 are enabled, and the amplifier 13 operates when the switching elements 14 and 20 are disabled.

The phase shifter 15 shifts the phase of the receive signal inputted to the phase shifter 15 so that the amount of phase shift of the receive signal when the receive signal inputted from the input terminal 16 is passed through the amplifier 13 is substantially equal to the amount of phase shift of the receive signal when the receive signal inputted from the input terminal 16 is passed through the switching element 14, the phase shifter 15 and the switching element 20.

In the variable gain amplifying apparatus 18 of FIG. 1, if the level of the receive signal inputted to the input terminal 16 is equal to or lower than a predetermined level, the switching element 14 is disabled, but the other end of the phase shifter 15 is still connected to the output of the amplifier 13. Therefore, due to the fact that the phase shifter 5 is connected to the output of the amplifier 13, the quality of the amplifier 13 is more or less compromised.

Similarly, in the variable gain amplifying apparatus 19 of FIG. 2, if the level of the receive signal inputted to the input terminal 16 is equal to or lower than a predetermined level, the switching element 14 is disabled, but the other end of the phase shifter 15 is still connected to the input of the amplifier 13. Therefore, due to the fact that the phase shifter 15 is connected to the input of the amplifier 13, the quality of the amplifier 13 is more or less compromised.

In the amplifier 13 of FIG. 3, on the other hand, if the level of the receive signal inputted to the input terminal 16 is equal to or lower than a predetermined level, the switching elements 14 and 20 are both disabled, and therefore the phase shifter 15 is disconnected from the input and output of the amplifier 13. Thus, in the variable gain amplifying apparatus 21 of FIG. 3, certain degradation of the amplifier 13 caused by the phase shifter 15 can be prevented in addition to attaining the effectiveness of this embodiment.

Figure 25:
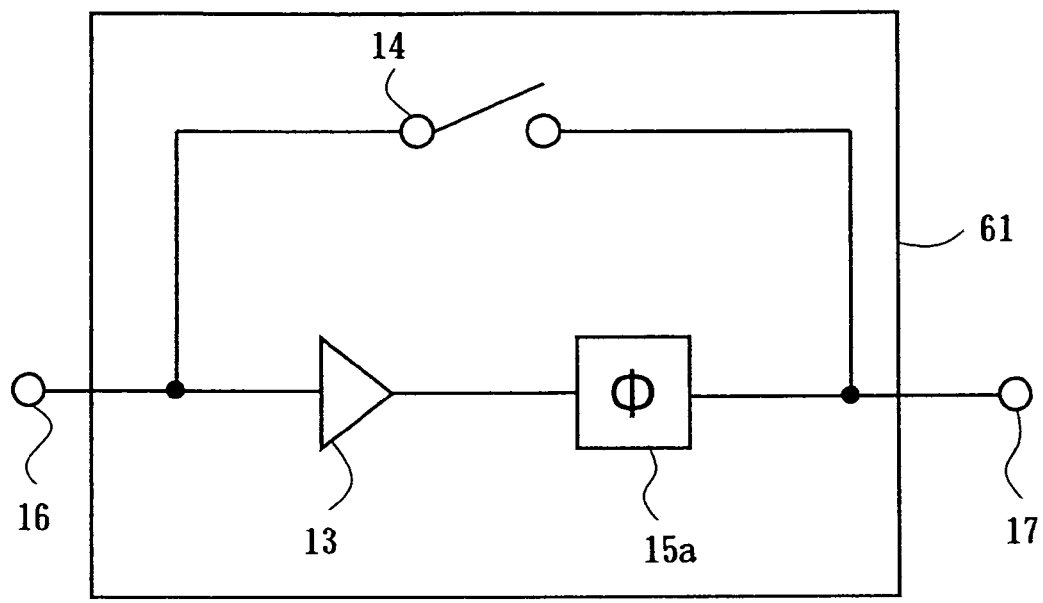
FIG. 25(A) shows the configuration of the variable gain amplifying apparatus with another configuration in the first embodiment of the present invention.
FIG. 25(B) shows the configuration of the variable gain amplifying apparatus with another configuration in the first embodiment of the present invention.
Figure 25:
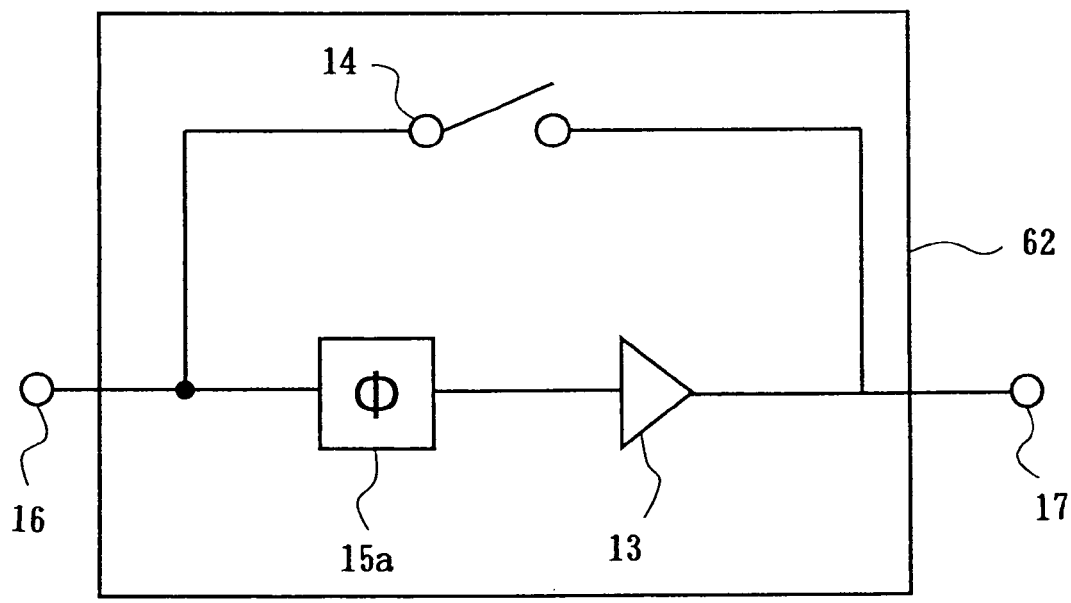

A variable gain amplifying apparatus 61 having a configuration different from that of FIG. 1 is shown in FIG. 25(A). Unlike the variable gain amplifying apparatus 18 of FIG. 1, the variable gain amplifying apparatus 61 has a phase shifter 15a connected in series to the amplifier 13.

Specifically, in the variable gain amplifying apparatus 61, one end of the switching element 14 is connected to the input of the amplifier 13, the other end of the switching element 14 is connected to one end of the phase shifter 15a, and the other end of the phase shifter 15a is connected to the output of the amplifier 13. The phase shifter 15a is not same as the phase shifter 15 of the variable gain amplifying apparatus 18 of FIG. 1. That is, the phase shifter 15a shifts the phase of the receive signal inputted to the phase shifter 15a so that the amount of phase shift of the receive signal when the receive signal is passed through the amplifier 13 and the phase shifter 15a is substantially equal to the amount of phase shift of the receive signal when the receive signal is passed through the switching element 14.

The positions of the phase shifter 15a and the amplifier 13 of the variable gain amplifying apparatus 61 may be changed to each other. A variable gain amplifying apparatus 62 resulting from the change of these positions is shown in FIG. 25(B). In the variable gain amplifying apparatus 62, one end of the phase shifter 15a is connected to the input of the amplifier 13, and the other end of the phase shifter 15a is connected to one end of the switching element 14. The output of the amplifier 13 is connected to the other end of the switching element 14. In this way, even if the positions of the phase shifter 15a and the amplifier 13 are changed to each other, a same degree of effectiveness as that of this embodiment can be attained. As shown in FIGS. 25(A) and 25(B), the amplifier 13 may also be connected in series to the phase shifter 15a.

Second Embodiment

The second embodiment will now be described.

Figure 4:
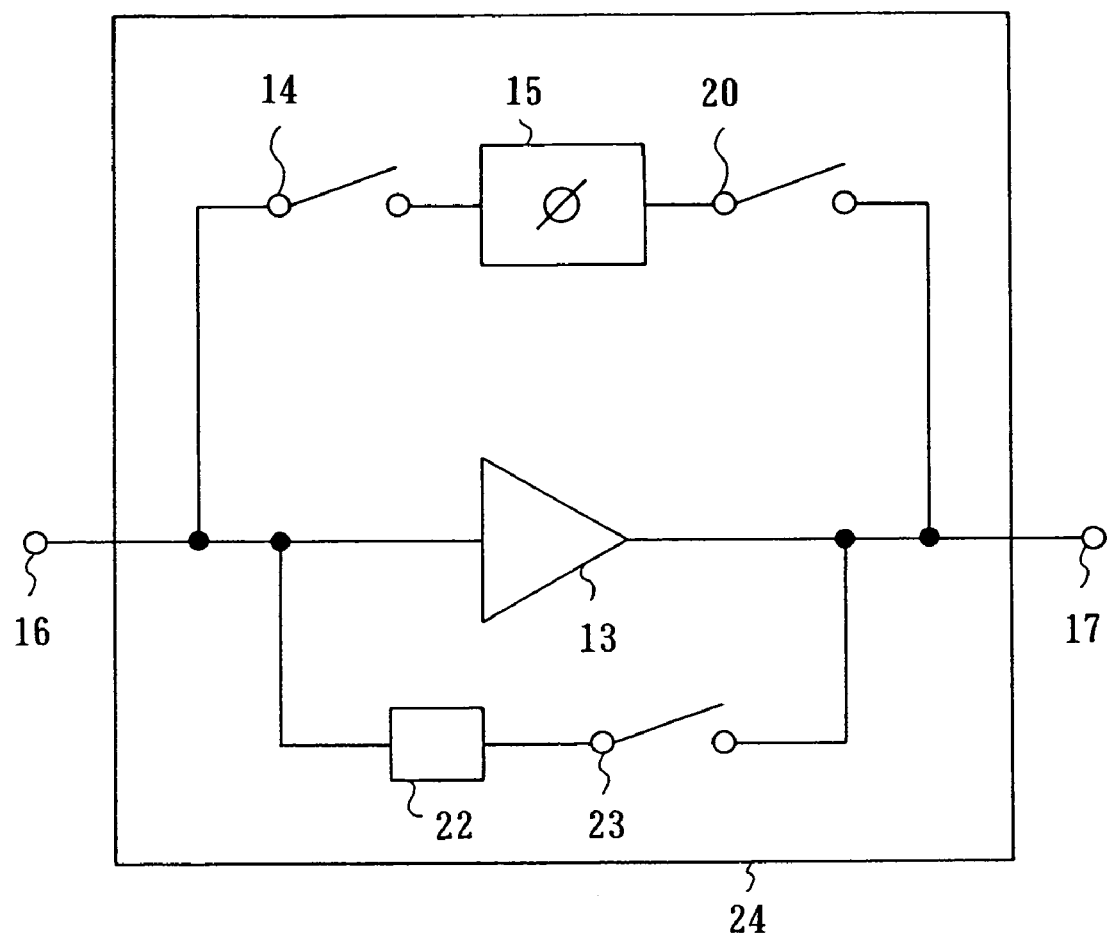
FIG. 4 shows the configuration of the variable gain amplifying apparatus in the second embodiment of the present invention.

A variable gain amplifying apparatus 24 of this embodiment is shown in FIG. 4. The variable gain amplifying apparatus 24 is used as, for example, the variable gain amplifying apparatus 4 of the cellular phone terminal of FIG. 21. Furthermore, the parts identical to those of the first embodiment are given same symbols and descriptions thereof are not presented here.

The variable gain amplifying apparatus 24 is comprised of the amplifier 13, the switching element 14, the phase shifter 15, the switching element 20, a feedback circuit 22 and a switching element 23.

The amplifier 13 has its input connected to the input terminal 16 and its output connected to the output terminal 17. The switching element 14 is connected at one end to the input of the amplifier 13, and connected at the other end to one end of the phase shifter 15. The other end of the phase shifter 15 is connected to one end of the switching element 20, and the other end of the switching element 20 is connected to the output of the amplifier 13. One end of the switching element 23 is connected to the output of the amplifier 13, the other end of the switching element 23 is connected to one end of the feedback circuit 22, and the other end of the feedback circuit 22 is connected to the input of the amplifier 12.

The operation of this embodiment will now be described.

The variable gain amplifying apparatus 24 of this embodiment is operated by being controlled by being controlled in accordance with a control circuit (not shown) as in the case of the first embodiment. This control circuit controls the operation of the variable gain amplifying apparatus 18 depending on the level of the receive signal received at the antenna 1.

That is, control is performed so that the switching elements 14 and 20 are enabled if the level of the input signal is higher than a predetermined level, and the switching elements 14 and 20 are disabled if the level of the input signal is equal to or lower than the predetermined level.

Control is performed so that the amplifier 13 does not operate when the switching element 14 is enabled, and the amplifier 13 operates when the switching element 14 is disabled. This control is performed by, for example, supplying a power voltage for operating the amplifier 13 when the amplifier 13 is to be operated, and stopping the supply of a power voltage for operating the amplifier 13 when the operation of the amplifier 13 is to be stopped. In addition, the switching element 23 is disabled when the switching elements 14 and 20 are enabled, and the switching element 23 is enabled when the switching elements 14 and 20 are disabled.

Thus, if the level of the receive signal is higher than a predetermined level, the variable gain amplifying apparatus 24 operates in the low gain mode. That is, since the switching elements 14 and 20 are enabled, and the amplifier 13 stops operating, and the switching element 23 is disabled, the receive signal is inputted from the input terminal 16, passed through the switching element 14, the phase shifter 15 and the switching element 20, and outputted from the output terminal 17.

On the other hand, if the level of the receive signal is equal to or lower than the predetermined level, the variable gain amplifying apparatus 18 operates in the high gain mode, That is, since the switching elements 14 and 20 are disabled, and the amplifier 13 operates, and the switching element 23 is enabled, the receive signal is inputted from the input terminal 16, amplified by the amplifier 13, and outputted from the output terminal 17, and for some output signals from the amplifier 13, a negative feedback is applied to the input of the amplifier 13 via the switching element 23 and the feedback circuit 22.

The phase shifter 15 shifts the phase of the receive signal inputted to the phase shifter 15 so that the amount of phase shift of the receive signal when the receive signal is passed through the amplifier 13 is substantially equal to the amount of phase shift of the receive signal when the receive signal is passed through the switching element 14, the phase shifter 15 and the switching element 20.

Therefore, even if the signal level of the receive signal is changed, and as a result, the variable gain amplifying apparatus 24 is switched from the high gain mode to the low gain mode, or switched from the low gain mode to the high gain mode, the phase of the signal outputted from the output terminal 17 is not shifted in a discontinuous manner.

That is, the phase of the input signal inputted to the orthogonal demodulator of FIG. 21 is not shifted in a discontinuous manner even if the mode of the variable gain amplifying apparatus 24 is switched, thus making it possible to prevent disconnection of received voices from the cellular phone terminal and occurrence of noises associated with the switching of the mode. Thus, by using the variable gain amplifying apparatus 24 of this embodiment in the pre-amplifier of the reception apparatus in the radio system represented by cellular phones, cellular phone terminals and the like with high quality of received voice can be provided.

Figure 5:
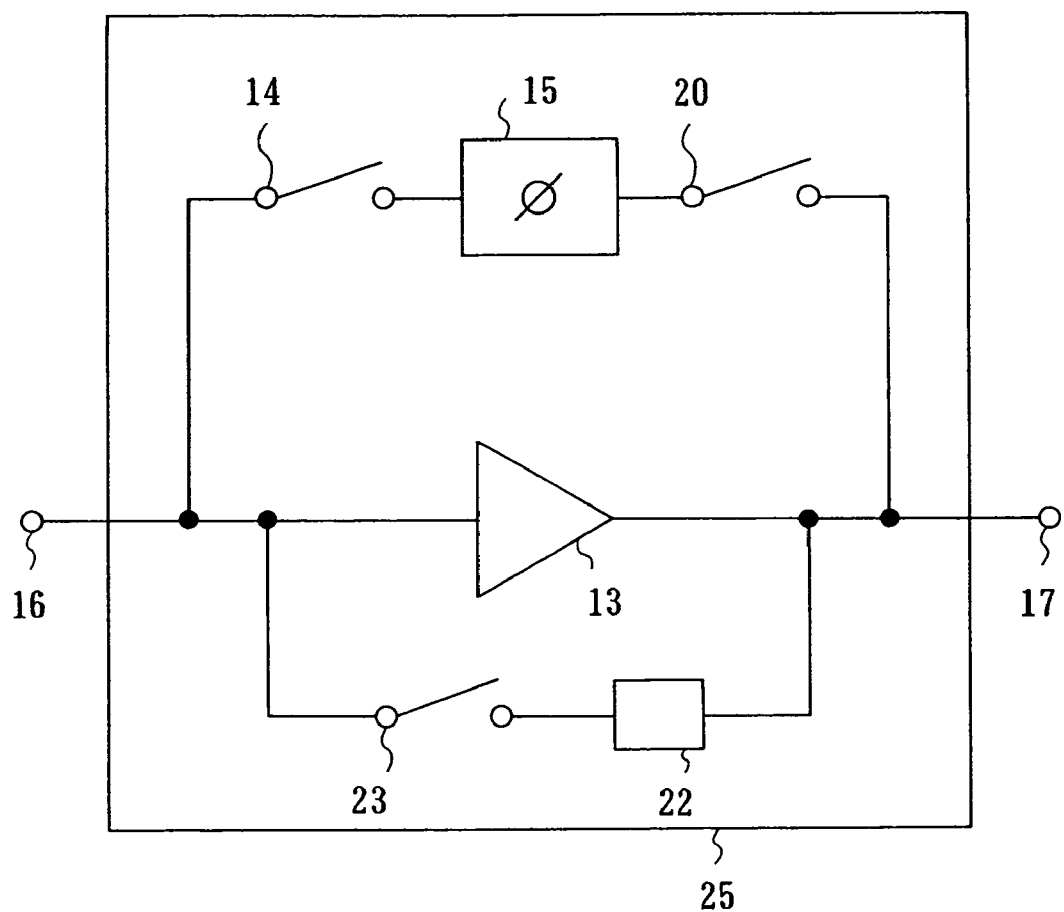
FIG. 5 shows another configuration of the variable gain amplifying apparatus in the second embodiment of the present invention.

A variable gain amplifying apparatus 25 in which the positions of the switching element 23 and the feedback circuit 22 in the variable gain amplifying apparatus 24 of FIG. 4 are changed to each other is shown in FIG. 5. That is, in the variable gain amplifying apparatus 25, one end of the switching element 23 is connected to the input of the amplifier 13, the other end of the switching element 23 is connected to one end of the feedback circuit 22, and the other end of the feedback circuit 22 is connected to the output of the amplifier 13. Use of the variable gain amplifying apparatus 25 makes it possible to attain a same degree of effectiveness as that of this embodiment.

Third Embodiment

The third embodiment will now be described.

Figure 6:
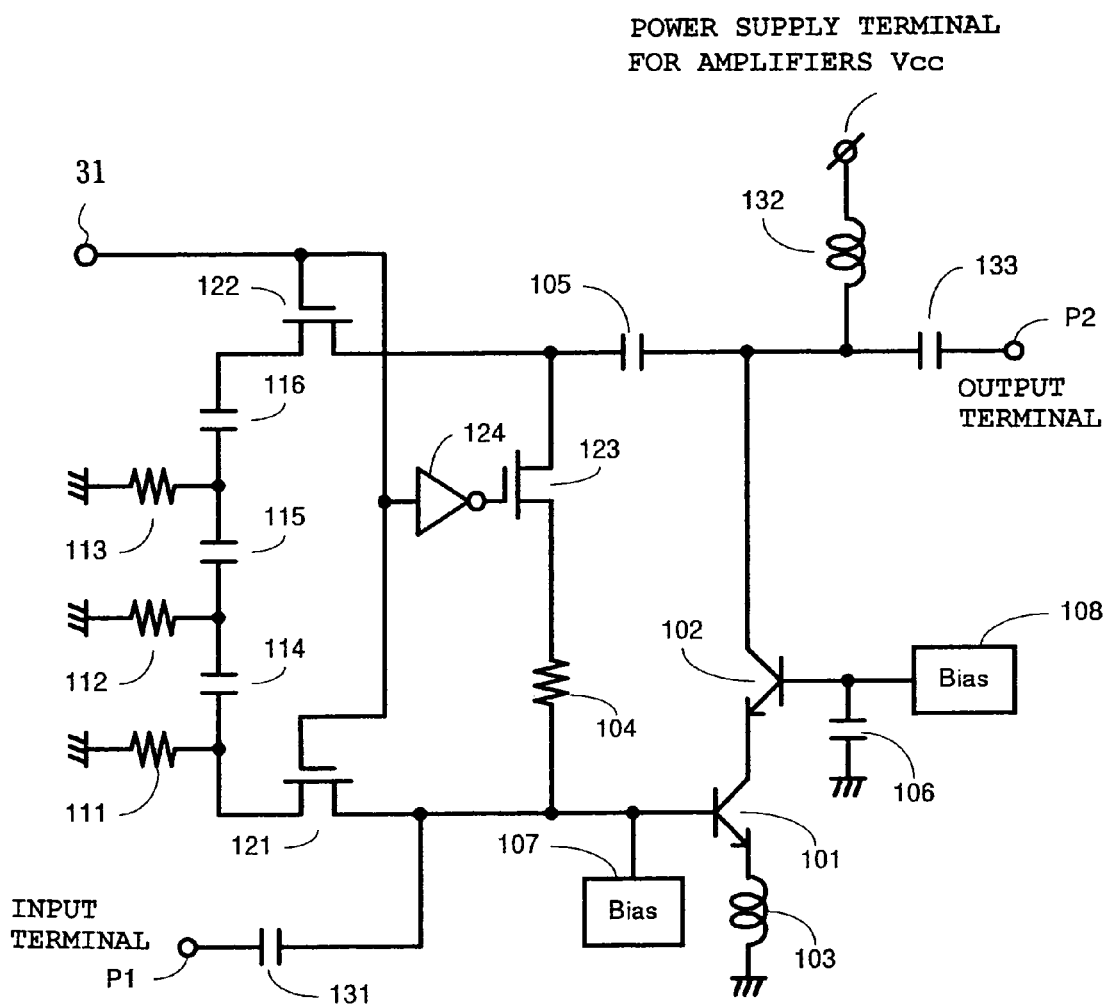
FIG. 6 is a circuit diagram of the variable gain amplifying apparatus in the third embodiment of the present invention.

FIG. 6 is a circuit diagram of a variable gain amplifying apparatus 30 of this embodiment.

In the variable gain amplifying apparatus 30 shown in FIG. 6, an input terminal P1 is connected to one end of an input side capacitor 131 for breaking direct currents, and the other end of the input side capacitor 131 is connected to one end of a switching element 121 and the base of a transistor 101. A bias power circuit 107 is connected to the base of the transistor 101, the emitter of the transistor 101 is grounded through an inductor 103 for widening the input dynamic range, and the collector of the transistor 101 is connected to the emitter of a transistor 102. The base of the transistor 102 is connected to a bias power circuit 108 and a bypass capacitor 106 which is grounded. The collector of the transistor 102 is connected to one end of an output side capacitor 133 for breaking direct currents and one end of a negative feedback side capacitor 105 for breaking direct currents, and the collector of the transistor 102 is also connected to a power supply terminal for amplifiers Vcc through a choke coil 132 for high-frequency cutoff. The other end of the output side capacitor 133 is connected to an output terminal P2.

The other end of the negative feedback side capacitor 105 is connected to one end of a switching element 123 and one end of switching element 122. The other end of the switching element 123 is connected to one end of a resistor 104 to apply a negative feedback, and the other end of the resistor 104 is connected to the base of the transistor 101.

The other end of the switching element 122 is connected to one end of a capacitor 116, and the other end of the capacitor 116 is connected to a grounded resistor 113 and one end of a capacitor 115. The other end of the capacitor 115 is connected to a grounded resistor 112 and one end of a capacitor 114. The other end of the capacitor 114 is connected to a grounded resistor 111 and the other end of the switching element 121.

A switching element power supply terminal 31 is connected to a terminal for control of the switching element 121 and the switching element 122. In addition, the switching element power supply terminal 31 is connected to one end of an inverter 124, and the other end of the inverter 124 is connected to a terminal for control of the switching element 123.

The variable gain amplifying apparatus 30 of this embodiment corresponds to the variable gain amplifying apparatus 24 of the second embodiment of FIG. 4.

Specifically, the input terminal P1 corresponds to the input terminal 16 of FIG. 4, the terminal P2 corresponds to the output terminal 17 of FIG. 4, the resistor 104 corresponds to the feedback circuit 22 of FIG. 4, the inverter 124 and the switching element 123 correspond to the switching element 23 of FIG. 4, and the transistors 101 and 102, the capacitor 106, the inductor 103, and the bias power circuits 107 and 108 correspond to the amplifier 13 of FIG. 4. The capacitors 114, 115 and 116 and the resistors 111, 112 and 113 correspond to the phase shifter 15 of FIG. 4, the switching element 121 corresponds to the switching element 14 of FIG. 4, and the switching element 122 corresponds to the switching element 20 of FIG. 4.

The switching element power supply terminal 31 is a terminal to supply a power voltage for changing the states of the switching elements 121, 122 and 123 from the enabled state to the disabled state and vice versa.

The bias power circuit 107 is a circuit to supply a bias voltage to the base of the transistor 101, and the bias power circuit 108 is a circuit to supply a bias voltage to the base of the transistor 102, and is capable of stopping and starting the supply of operating voltage by means of a control circuit (not shown).

The power supply terminal for amplifiers Vcc is a terminal to supply operating voltage to the transistors 102 and 101.

The switching element power supply terminal 21 is a terminal to change the states of the switching elements 121, 122 and 123 from the enabled state to the disabled state and vice versa by supplying a control power voltage or stopping the supply of the power voltage to the respective control terminals for the switching elements 121, 122 and 123.

Furthermore, the terminals of this embodiment such as the input terminal P1 and the output terminal P2 also include terminals such as pad electrodes and modes as junction points of elements in the wiring.

The resistors 111, 112 and 113 and the like are made of polysilicon, and the capacitors 114, 115 and 116 and the like are composed of MOS capacitors. Furthermore, the capacitors 114, 115 and 116 may be composed of MIM capacitors.

The operation of this embodiment will now be described.

In the case where the variable gain amplifying apparatus 30 is used in the high gain mode, the receive signal is amplified by elements such as the transistors 101 and 102, but these elements, namely the elements corresponding to the amplifier 13 of FIG. 4 cause the phase of the receive signal outputted from the output terminal P2 to be advanced farther than the phase of the receive signal inputted to the input terminal P1. The input impedance to the base of the transistor 101 is smaller than the output impedance of the collector of the transistor 102.

First, the operation of the variable gain amplifying apparatus 30 operating in the high gain mode will be described.

When the level of the receive signal inputted from the input terminal P1 is equal to or lower than a predetermined level, the variable gain amplifying apparatus 30 operates in the high gain mode. That is, when detecting that the level of the receive signal is lower than the predetermined level, the control circuit (not shown) supplies a voltage (e.g. voltage of 0V) allowing the switching elements 122 and 121 to become disabled as a control voltage that is supplied to the switching element power supply terminal 31. The control circuit (not shown) supplies a voltage allowing the transistors 101 and 102 to operate from the bias circuits 107 and 108. Thus, the transistors 101 and 102 become enabled.

At this time, the receive signal inputted from the input terminal P1 is passed through the input side capacitor 131 and then inputted to the base of the transistor 101. The receive signal is not flown to the capacitor 114 because the switching element 121 is disabled. The base of the transistor 101 is supplied with a bias voltage by the bias power circuit 107, and the base of the transistor 102 is supplied with a bias voltage by the bias power circuit 108. The receive signal inputted to the base of the transistor 101 is amplified by the transistors 101 and 102 and then outputted from the collector of the transistor 102.

Some of signals outputted from the collector of the transistor 102 are passed through the capacitor 133 and then outputted from the output terminal P2 to the rear stage such as the mixer 7. The other signals outputted from the collector of the transistor 102 are passed through the negative feedback side capacitor 105. The signal passed through the negative feedback side capacitor 105 is passed through the switching element 123, adjusted to a predetermined level in the resistor 104, and again inputted to the base of the transistor 101. The signal passed through the negative feedback side capacitor 105 is not flown to the capacitor 116 because the switching element 122 is disabled.

In this way, in the case of the high-gain mode, the receive signal inputted from the input terminal P1 is amplified in the transistors 101, 102 while receiving a negative feedback, and is then outputted from the output terminal P2 to the rear stage.

At this time, the phase of the receive signal outputted from the output terminal P2 is advanced farther than the phase of the receive signal inputted from the input signal P1, and the input impedance |Zi(high)| of the base of the transistor 101 is smaller than the output impedance |Zo(high)| of the collector of the transistor 102. However, Zi(high) and Zo(high) are both complex numbers.

The operation of the variable gain amplifying apparatus 30 operating in the low gain mode will now be described.

When the level of the receive signal inputted from the input terminal P1 is higher than a predetermined level, the variable gain amplifying apparatus 30 operates in the low gain mode. That is, when detecting that the level of the receive signal is higher than the predetermined level, the control circuit (not shown) turns to the low gain mode in order to prevent the situation in which the transistors 101 and 102 are saturated.

That is, when detecting that the level of the receive signal is higher than the predetermined level, the control circuit (not shown) supplies a voltage (e.g. voltage of 3V) allowing the switching elements 122 and 121 to become enabled as a control voltage that is supplied to the switching element power supply terminal 31. The control circuit (not shown) stops supplying a voltage allowing the transistors 101 and 102 from the power supply terminal for amplifiers Vcc. Thus, the transistors 101 and 102 stop their operations.

At this time, the receive signal inputted from the input terminal P1 is passed through the input side capacitor 131, the switching element 121, the capacitors 114, 115 and 116, and a circuit portion consisting of the capacitors 114, 115 and 116 and resistors 111, 112 and 113. This circuit portion functions as the phase shifter 15 of FIG. 4 as described above. An adjustment is made so that the phase of the receive signal inputted from the input terminal P1 is advanced in this circuit portion.

Specifically, the ratio between the resistance value of the resistor 111 and the resistance value of the resistor 112 and the resistance value of the resistor 113 is 1:a:a². The ratio between the capacitance value of the capacitor 114 and the capacitance value of the capacitor 115 and the capacitance value of the capacitor 116 is a²:a:1. Here, an adjustment is made so that a represents a predetermined value greater than 1.

The circuit portion functioning as the phase shifter 15 of FIG. 4 has basic unit circuits each consisting of a resistor and a capacitor combined in three stages. The circuit portion functioning as the phase shifter 15 of FIG. 4 also plays a role as an impedance converter.

Given that the input impedance of a circuit being the first-stage basic unit circuit that consists of the resistor 111 and the capacitor 114 equals Z1, the output impedance of this circuit may be expressed as a |Z1| using the above described predetermined numeric value a. Here, Z1 is a complex number. Thus, the input impedance of a circuit being the second-stage basic unit circuit that consists of the resistor 112 and the capacitor 115 equals a |Z1|, and therefore the output impedance of this circuit is expressed as a²|Z1| using the above described numeric value a. Thus, the input impedance of a circuit being the third-stage basic unit circuit that consists of the resistor 113 and the capacitor 116 equals a²|Z1|, and therefore the output impedance of this circuit is expressed as a³|Z1|. In this way, the value of the output impedance of the basic unit circuit in a certain stage is relatively close to the value of the output impedance of the basic unit in the following stage, and thus a loss between the stages is reduced. In addition, the frequency properties of passing phases between stages are relatively close to each other.

On the other hand, as described above, the input impedance of the base of the transistor 101 equals |Zi(high)|, and the output impedance of the collector of the transistor 102 equals |Zo(high)| in the case of high gain mode, and |Zi(high)| is smaller than the output impedance |Zo(high)| of the collector of the transistor 102.

Thus, the value of a is defined as a value satisfying the following equation 11.

$$|Zo(high)|/|Zi(high)|=a^3 \quad \text{[Equation 11]}$$

In addition, the impedances Z1 and Zi(high) are made to be close to each other, whereby the value of output impedance in the high gain mode is relatively close to the value of output impedance in the low gain mode. In this case, since the passing phase of the circuit portion functioning as the phase shifter 15 of FIG. 4 is uniquely determined, the value of passing phase is made to be close to the value of passing phase in the high gain mode by increasing/decreasing the number of stages of basic unit circuits consisting of resistors and capacitors. Furthermore, in the case where the circuit portion functioning as the phase shifter 15 of FIG. 4 is constituted by n basic unit circuits (n is an integer number greater than 1), the value of a is defined as a value satisfying the following equation 12.

$$|Zo(high)|/|Zi(high)|=a^n \quad \text{[Equation 12]}$$

Therefore, by passing through this circuit portion, a receive signal is outputted from the output terminal P2 as a signal of which amount of phase advance is substantially equal to the amount of advance of the passing phase in the case of high gain mode.

That is, the signal passed through this circuit portion is passed through the switching element 122. Because the switching element 124 is disabled, this signal is not flown to the resistor 104. Thus, the signal passed through the switching element 122 is passed through the negative feedback side capacitor 105 and then outputted from the output terminal P2 through the output side capacitor 133.

As described above, the phase of a passing signal is adjusted in the portion corresponding to the phase shifter 15 of FIG. 4, and therefore even if the variable gain amplifying apparatus is switched from the high gain mode to the low gain mode, the situation in which the phase of the signal outputted from the output terminal P2 is shifted in a discontinuous manner can be sufficiently alleviated.

Figure 26:
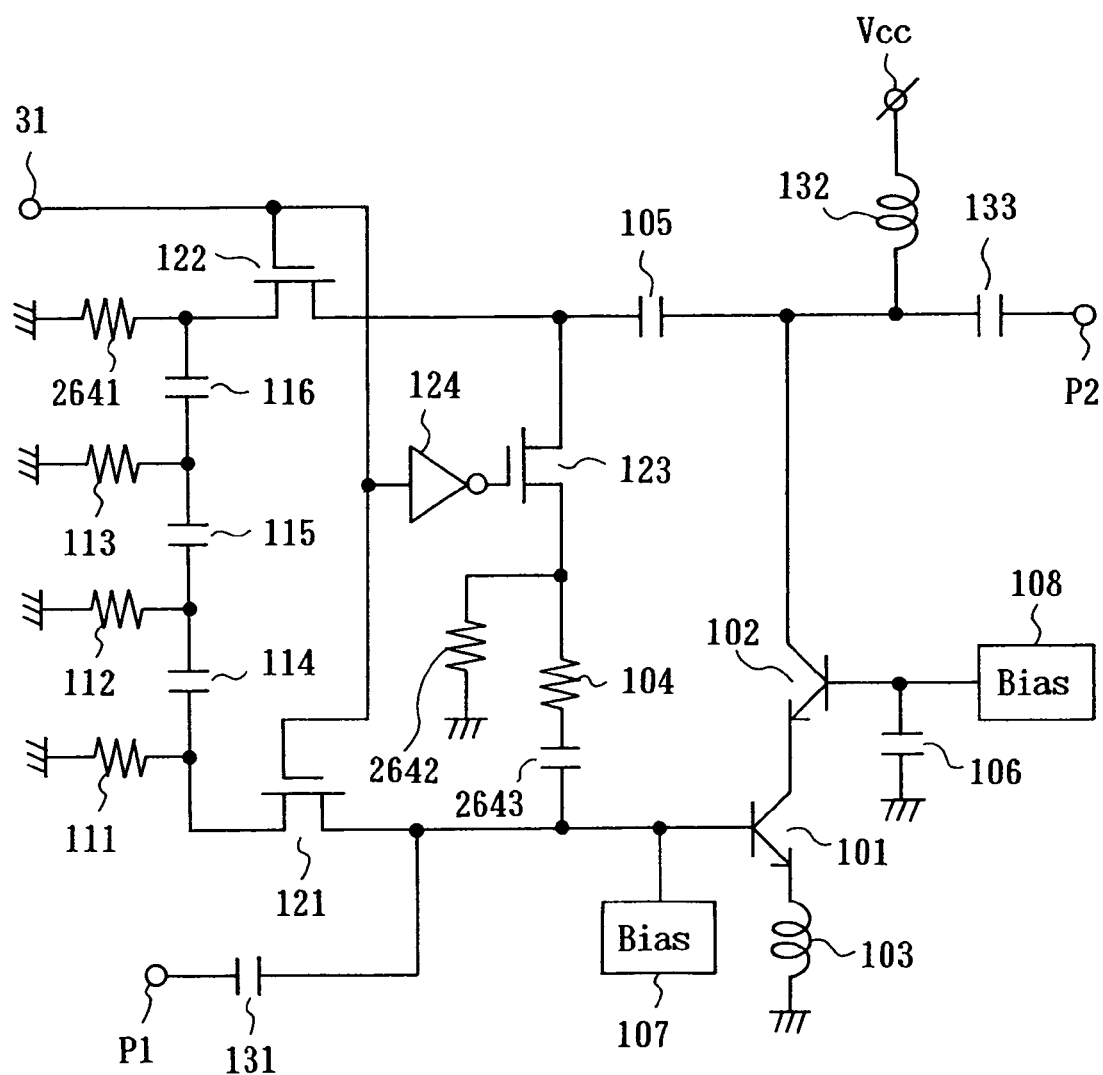
FIG. 26 is a circuit diagram of the variable gain amplifying apparatus with another configuration in the fourth embodiment of the present invention.

Furthermore, the variable gain amplifying apparatus 30 of this embodiment may have a configuration in which a resistor 2641 is inserted between the switching element 122 and the ground, a resistor 2642 is inserted between the switching element 123 and the ground, and a capacitor 2643 is inserted between the base of the transistor 101 and the resistor 104, as shown in FIG. 26. Thereby, the switching elements 121, 122 and 123 take on 0 potentials at least at one ends, and therefore the switching elements are reliably enabled/disabled, and the insertion loss when the switching elements are enabled is improved.

Inductor quarter wave lines may be used instead of the resistors 2641, 2642.

Furthermore, the variable gain amplifying apparatus 30 of this embodiment has been described as an unbalanced circuit, but may also be achieved as a balanced circuit.

Figure 7:
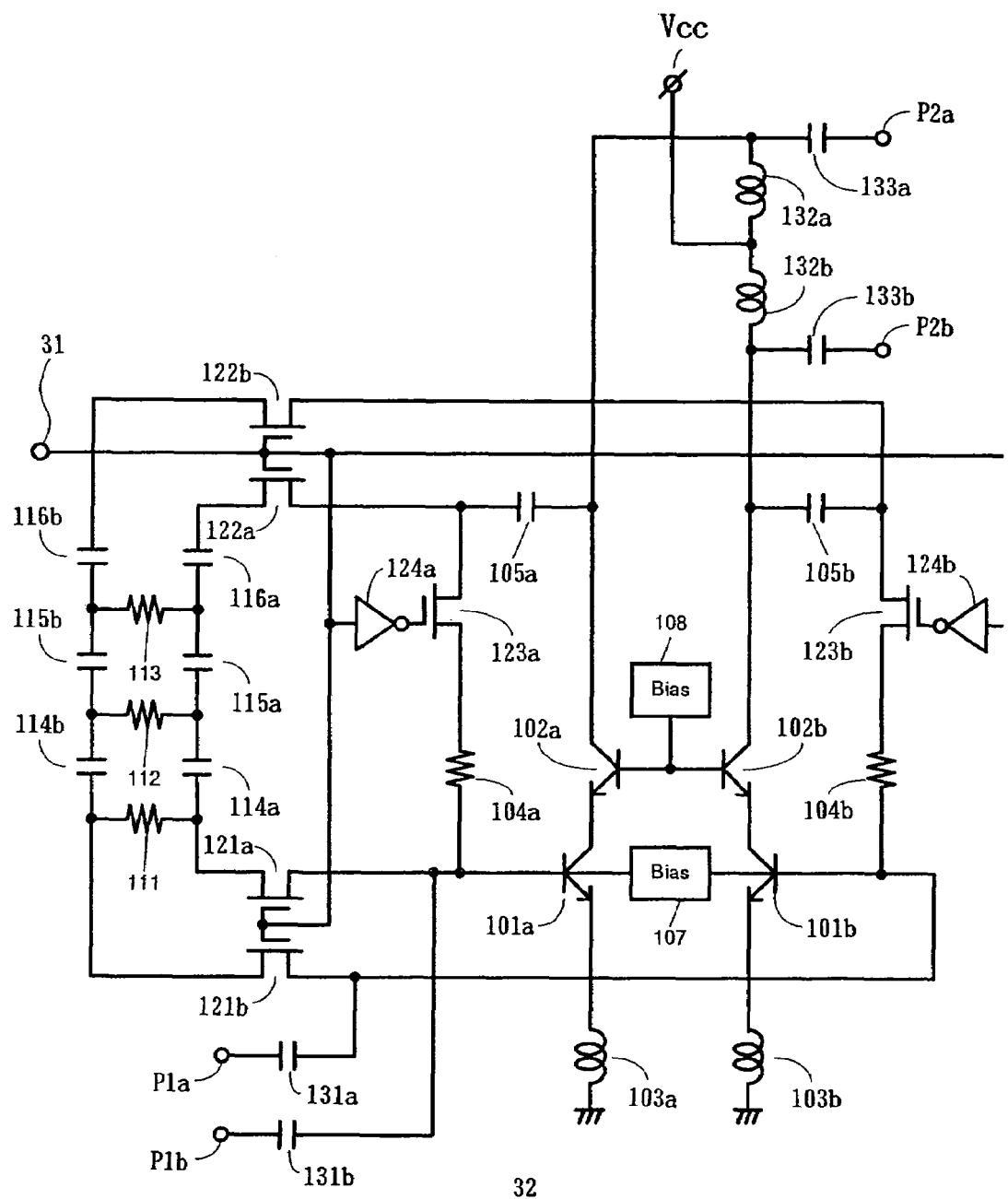
FIG. 7 is a circuit diagram of the variable gain amplifying apparatus having balanced circuits in the third embodiment of the present invention.

That is, a variable gain amplifying apparatus 32 achieved as a balanced circuit by modifying the variable gain amplifying apparatus 30 of this embodiment is shown in FIG. 7.

The input terminal P1 of FIG. 6 is replaced by input terminals P1a and P1b in FIG. 7, the input side capacitor 131 of FIG. 6 is replaced by input side capacitors 131a, 131b in FIG. 7, the switching element 121 of FIG. 6 is replaced by switching elements 121a, 121b in FIG. 7, the transistor 101 of FIG. 6 is replaced by transistors 101a, 101b in FIG. 7, the transistor 102 of FIG. 6 is replaced by transistors 102a, 102b in FIG. 7, the inductor 103 of FIG. 6 is replaced by inductors 103a, 103b in FIG. 7, the resistor 104 of FIG. 6 is replaced by resistors 104a, 104b in FIG. 7, the output side capacitor 133 of FIG. 6 is replaced by output side capacitors 133a, 133b in FIG. 7, the choke coil 132 of FIG. 6 is replaced by choke coils 132a, 132b in FIG. 7, the negative feedback side capacitor 105 of FIG. 6 is replaced by negative feedback side capacitors 105a, 105b in FIG. 7, the inverter 124 and the switching element 123 of FIG. 6 are replaced by inverters 124a and 124b and switching elements 123a and 123b, respectively in FIG. 7, the switching element 122 of FIG. 6 is replaced by switching elements 122a, 122b in FIG. 7, the capacitors 114, 115 and 116 of FIG. 6 are replaced by capacitors 114a and 114b, capacitors 115a and 115b and capacitors 116a and 116b, respectively in FIG. 7, and the output terminal P2 of FIG. 6 is replaced by output terminals P2a, P2b in FIG. 6. Other aspects of the configuration are same as those of the variable gain amplifying apparatus 30 of this embodiment, and therefore descriptions thereof are not presented here.

Furthermore, the variable gain amplifying apparatus 32 may also have a configuration in which the switching elements 121, 122, 123a and 123b take on 0 potentials at least at one ends as in the case of the variable gain amplifying apparatus 30. By this configuration, the switching elements are reliably enabled/disabled, and the insertion loss when the switching elements are enabled is improved.

In this way, the variable gain amplifying apparatus 30 of this embodiment may be achieved as a balanced circuit like the variable gain amplifying apparatus 32, for example.

Furthermore, in the variable gain amplifying apparatus 30 of FIG. 6, when the variable gain amplifying apparatus is used in the high gain mode, the receive signal is passed through the circuit portion corresponding to the amplifier 13 of FIG. 4, whereby the phase of the receive signal outputted from the output terminal P2 is advanced farther than the phase of the receive signal inputted to the input terminal P1, and the input impedance to the base of the transistor 101 is smaller than the output impedance of the collector of the transistor 102, but the circuit portion corresponding to the phase shifter 15 of FIG. 4 should be changed if the circuit portion corresponding to the amplifier 13 of FIG. 4 has a characteristic other than that described above.

Figure 8:
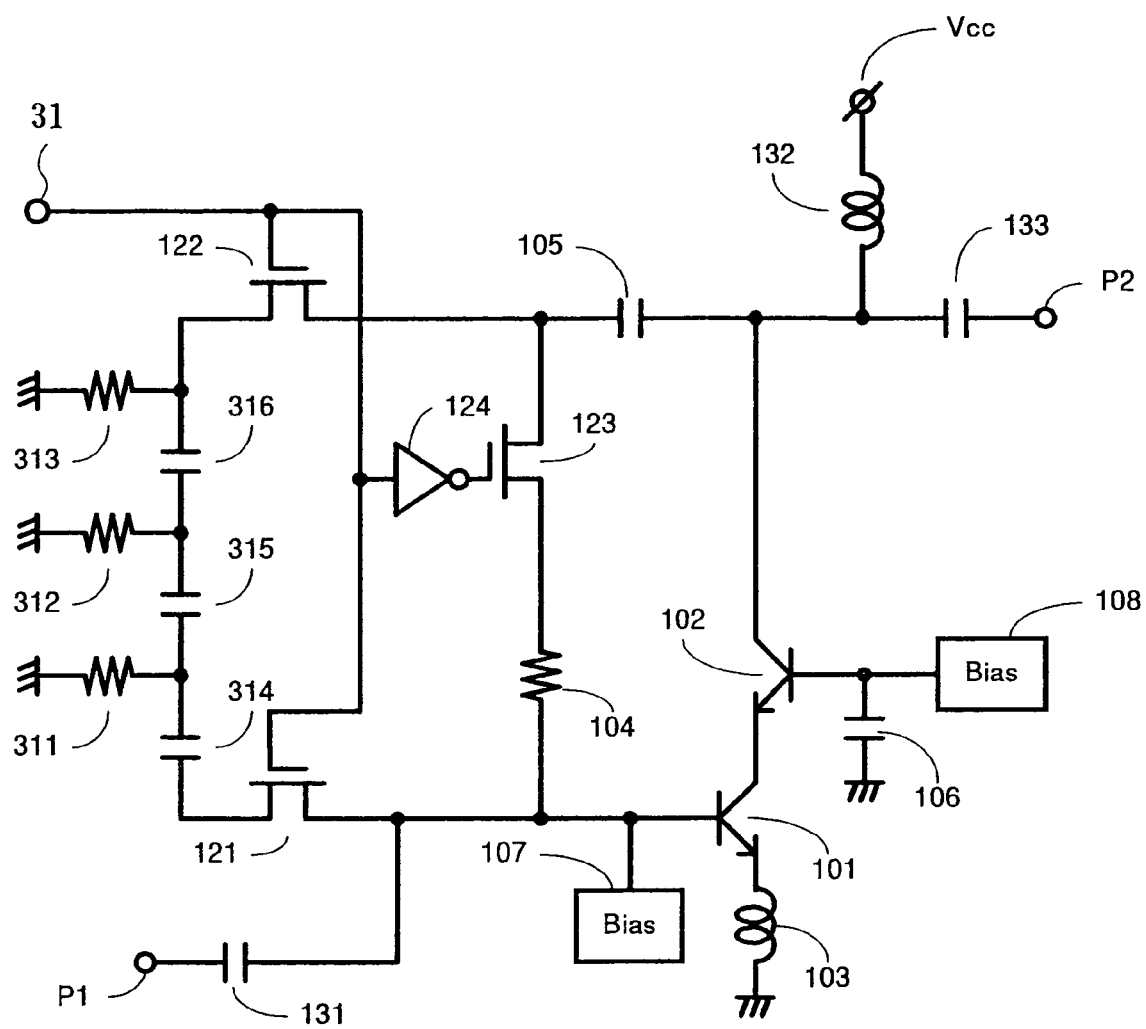
FIG. 8 is a circuit diagram of the variable gain amplifying apparatus with another configuration in the third embodiment of the present invention.

First, a circuit diagram of a variable gain amplifying apparatus 33 in which the circuit portion corresponding to the phase shifter 15 is changed is shown in FIG. 8. For the variable gain amplifying apparatus 33, the passing phase in the high gain mode is advanced, and the input impedance of the portion corresponding to the amplifier 13 is larger than the output impedance of the same portion.

For the portion corresponding to the phase shifter 15 of FIG. 4 in the variable gain amplifying apparatus 33, one end of a capacitor 314 is connected to one end of the switching element 121, and the other end of the capacitor 314 is connected to a grounded resistor 311 and to one end of a capacitor 315. The other end of the capacitor 315 is connected to a grounded resistor 312 and to one end of a capacitor 316. The other end of the capacitor 316 is connected to a grounded resistor 313 and to one end of the switching element 122.

The circuit portion functioning as the phase shifter 15 of FIG. 4 in the variable gain amplifying apparatus 33 adjusts the phase in the same way as the third embodiment.

Specifically, the ratio between the resistance value of the resistor 311 and the resistance value of the resistor 312 and the resistance value of the resistor 313 is $1:a:a^2$. The ratio between the capacitance value of the capacitor 314 and the capacitance value of the capacitor 315 and the capacitance value of the capacitor 316 is $a^2:a:1$. Here, an adjustment is made so that the value of a equals a predetermined value smaller than 1. That is, the value of a is previously designed so as to provide an amount of phase advance equal to the amount of advance of the phase of the receive signal outputted from the output terminal P2 relative to the phase of the receive signal inputted from the input terminal P1 in the case of high gain mode. The value of the value of a can be determined in the same way as described above.

Therefore, by passing through this circuit portion, a receive signal of which amount of phase advance is substantially equal to the amount of advance of the passing phase in the case of high gain mode is outputted from the output terminal P2.

In this way, even if the passing phase of the receive signal in the case of high gain mode is advanced, and the input impedance of the portion corresponding to the amplifier 13 is larger than the output impedance of the same portion, it is possible to sufficiently alleviate the situation in which the phase of the signal outputted from the output terminal P2 is shifted in a discontinuous manner when switching is done from the high gain mode to the low gain mode, or from the low gain mode to the high gain mode.

Furthermore, the variable gain amplifying apparatus 33 of this embodiment may have a configuration in which the switching elements 121, 122, 123 take on 0 potentials at least at one ends as in the case of the variable gain amplifying apparatus 30 of this embodiment. Thereby, the switching elements are reliably enabled/disabled, and the insertion loss when the switching elements are enabled is improved.

Furthermore, the variable gain amplifying apparatus 33 of this embodiment may also be comprised of balanced circuits as described in this embodiment.

Figure 9:
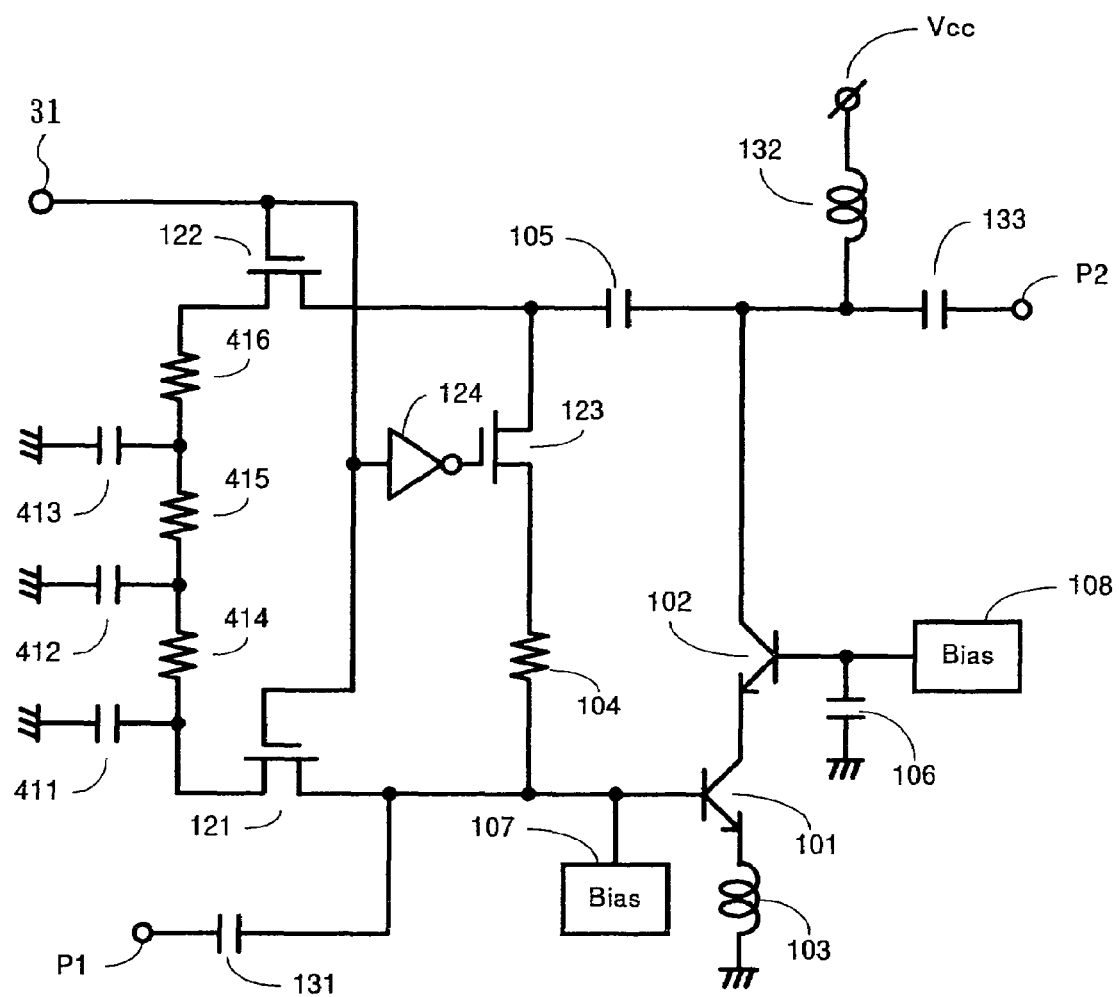
FIG. 9 is a circuit diagram of the variable gain amplifying apparatus with another configuration in the third embodiment of the present invention.

A circuit diagram of another variable gain amplifying apparatus 34 in which the circuit portion corresponding to the phase shifter 15 is changed is shown in FIG. 9. For the variable gain amplifying apparatus 34 of FIG. 9, the passing phase of the receive signal is delayed in the case of high gain mode, and the input impedance of the portion corresponding to the amplifier 13 is smaller than the output impedance of the same portion.

Specifically, for the portion corresponding to the phase shifter 15 of FIG. 4, one end of a resistor 414 is connected to one end of the switching element 121, a grounded capacitor 411 is connected to one end of the resistor 414, and the other end of the resistor 414 is connected to one end of a resistor 415 and to a grounded capacitor 412. A grounded capacitor 413 is connected to the other end of the resistor 415, and the other end of the resistor 415 is connected to one end of a resistor 416. The other end of the resistor 416 is connected to one end of the switching element 122.

The circuit portion functioning as the phase shifter 15 of FIG. 4 has the phase adjusted in the same way as this embodiment.

Specifically, the ratio between the resistance value of the resistor 414 and the resistance value of the resistor 415 and the resistance value of the resistor 416 is 1:a:a². The ratio between the capacitance value of the capacitor 411 and the capacitance value of the capacitor 412 and the capacitance value of the capacitor 413 is a²:a:1. Here, an adjustment is made so that the value of a equals a predetermined value smaller than 1. That is, the value of a is previously designed so as to provide an amount of phase delay equal to the amount of delay of the phase of the receive signal outputted from the output terminal P2 relative to the phase of the receive signal inputted from the input terminal P1 in the case of high gain mode. The value of the value of a can be determined in the same way as described above.

Thus, by passing through this circuit portion, a receive signal of which amount of phase delay is substantially equal to the amount of delay of the passing phase in the case of high gain mode is outputted from the output terminal P2.

In this way, even if the passing phase of the receive signal in the case of high gain mode is delayed, and the input impedance of the portion corresponding to the amplifier 13 is smaller than the output impedance of the same portion, it is possible to sufficiently alleviate the situation in which the phase of the signal outputted from the output terminal P2 is shifted in a discontinuous manner when switching is done from the high gain mode to the low gain mode, or from the low gain mode to the high gain mode.

Furthermore, the variable gain amplifying apparatus 34 of this embodiment may have a configuration in which the switching elements 121, 122, 123 take on 0 potentials at least at one ends as in the case of the variable gain amplifying apparatus 30 of this embodiment. Thereby, the switching elements are reliably enabled/disabled, and the insertion loss when the switching elements are enabled is improved.

Furthermore, the variable gain amplifying apparatus 34 of this embodiment may also be comprised of balanced circuits as described in this embodiment.

Figure 10:
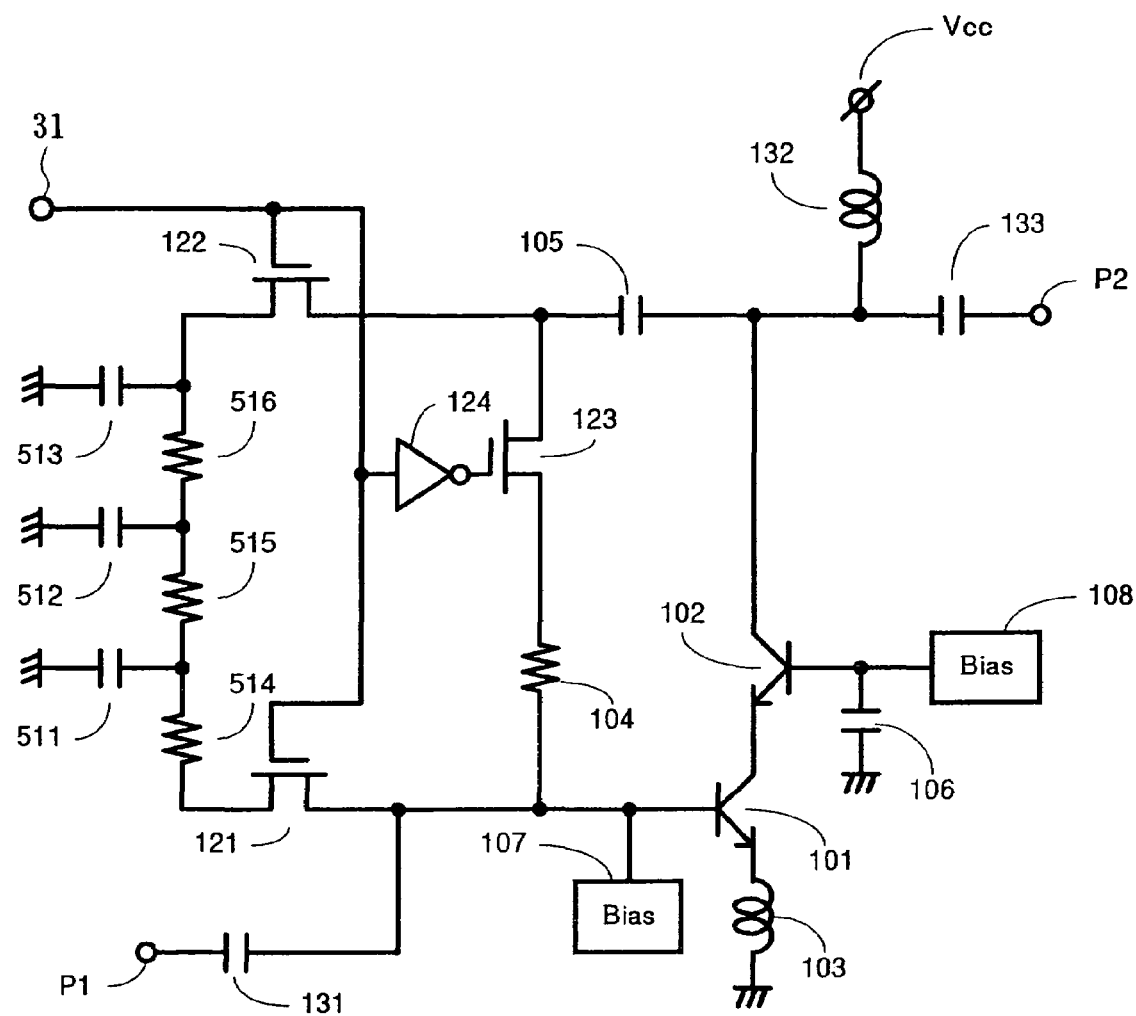
FIG. 10 is a circuit diagram of the variable gain amplifying apparatus having another configuration in the third embodiment of the present invention.

A circuit diagram of another variable gain amplifying apparatus 35 in which the circuit portion corresponding to the phase shifter 15 is changed is shown in FIG. 10. For the variable gain amplifying apparatus 35 of FIG. 10, the passing phase of the receive signal is delayed in the case of high gain mode, and the input impedance of the portion corresponding to the amplifier 13 is larger than the output impedance of the same portion.

For the portion corresponding to the phase shifter 15 of FIG. 4, one end of a resistor 514 is connected to one end of the switching element 121, and a grounded capacitor 511 is connected to the other end of the resistor 514, and one end of a resistor 515 is connected to the other end of the resistor 514. A grounded capacitor 512 is connected to the other end of the resistor 515, and the other end of the resistor 515 is connected to one end of a resistor 516. A grounded capacitor 513 is connected to the other end of the resistor 516, and one end of the switching element 122 is connected to the other end of the resistor 516.

The circuit portion functioning as the phase shifter 15 of FIG. 4 has the phase adjusted in the same way as this embodiment.

Specifically, the ratio between the resistance value of the resistor 514 and the resistance value of the resistor 515 and the resistance value of the resistor 516 is 1:a:a². The ratio between the capacitance value of the capacitor 511 and the capacitance value of the capacitor 512 and the capacitance value of the capacitor 513 is a²:a:1. Here, an adjustment is made so that the value of a equals a predetermined value smaller than 1. That is, the value of a is previously designed so as to provide an amount of phase delay equal to the amount of delay of the phase of the receive signal outputted from the output terminal P2 relative to the phase of the receive signal inputted from the input terminal P1 in the case of high gain mode. The value of the value of a can be determined in the same way as described above.

Therefore, by passing through this circuit portion, a receive signal of which amount of phase delay is substantially equal to the amount of delay of the passing phase in the case of high gain mode is outputted from the output terminal P2.

In this way, even if the passing phase of the receive signal in the case of high gain mode is delayed, and the input impedance of the portion corresponding to the amplifier 13 is larger than the output impedance of the same portion, it is possible to sufficiently alleviate the situation in which the phase of the signal outputted from the output terminal P2 is shifted in a discontinuous manner when switching is done from the high gain mode to the low gain mode, or from the low gain mode to the high gain mode.

Furthermore, the variable gain amplifying apparatus 35 of this embodiment may have a configuration in which the switching elements 121, 122, 123 take on 0 potentials at least at one ends as in the case of the variable gain amplifying apparatus 30 of this embodiment. Thereby, the switching elements are reliably enabled/disabled, and the insertion loss when the switching elements are enabled is improved.

Furthermore, the variable gain amplifying apparatus 35 may also be comprised of balanced circuits as described in this embodiment.

Furthermore, for the switching elements 121, 122 and 123, a FET switch made of potassium and arsenic, a MOSFET switch of triple-well structure and a switch of silicon-on-insulator structure, and the like may be used.

Figure 11:
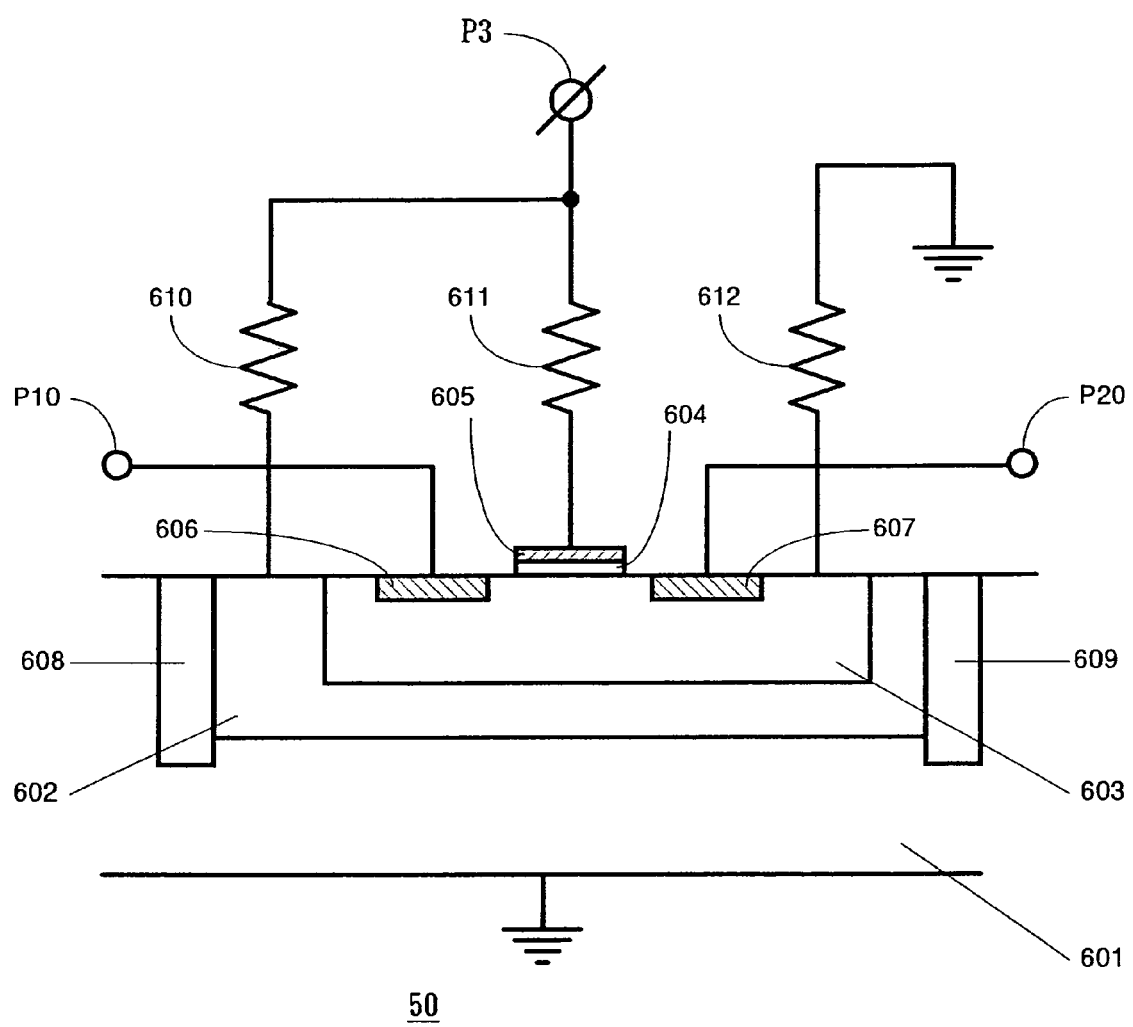
FIG. 11 is a schematic diagram showing the sectional structure of a high frequency switching element for use in the variable gain amplifying apparatus in the third embodiment of the present invention.

FIG. 11 schematically shows the cross sectional structure of a high frequency switching element 50 for use in the switching elements 121, 122 and 123. That is, the high frequency switching element is a MOSFET switch of triple-well structure.

As shown in FIG. 11, the high frequency switching element 50 is formed on an element formation area partitioned by trench portions 608, 609 selectively provided on a semiconductor substrate 601 made of P-type silicon, for example.

A n-type well 602 and a p-type well 603 surrounded by the n-type well 602 are formed on the element formation area in the semiconductor substrate 601.

A drain layer 606 and a source layer 607 are formed on the p-type well 603 with some distance therebetween, and a gate electrode 605 made of polysilicon is formed via a gate insulation film 604 made of silicon oxide in the area between the drain layer 606 and the source layer 607 on the p-type well 603.

In the case where the MOSFET switch 50 is the switching element 121 of FIG. 6, the drain layer 606 is connected to an input node P10 receiving the receive signal inputted from the input side capacitor 11 of FIG. 6, and the source layer 607 is connected to an output node P20 outputting the receive signal to the capacitor 114 and resistor 111 shown in FIG. 6.

The gate electrode 605 is connected to a voltage control terminal P3 receiving a control voltage supplied from the switching element power supply terminal 31 through a resistor 611, and a n-type well 602 is connected to voltage control terminal P3 through a resistor 610.

The semiconductor substrate 601 is grounded, and the p-type well 603 is grounded through a resistor 612.

For the high frequency switching element 50 constructed in this way, a reverse bias voltage is applied to between the n-type well 602 and the p-type well 603, resulting in a depletion layer by pn connection composed of the interface between the n-type well 602 and the p-type well 603, and thus the n-type well 602 and the p-type well 603 are insulated from each other in the vertical direction relative to the substrate surface. In addition, a reverse voltage is applied to between the semiconductor substrate 601 and the n-type well 602, resulting in a depletion layer by pn connection composed of the interface between the semiconductor substrate 601 and the n-type well 602, and thus the semiconductor substrate 601 and the n-type well 602 are insulated from each other.

Thus, when the high frequency switching element 50 is enabled, the level of losses of the receive signal due to the situation in which the receive signal inputted to the input node P10 leaks into the semiconductor substrate 601 from the drain layer 606, the source layer 607 and the channel area formed between the drain layer 606 and the source layer 607 can be reduced, and as a result, the level of insertion losses by the high frequency element 50 during operation in the low gain mode can be reduced.

In addition, by using the triple well structure in this way, the level of leakage into the semiconductor substrate 601 of the receive signal inputted to the input node P10 through the drain layer 606 can be reduced even when the high frequency switching element 50 is disabled. As a result, degradation of noise characteristics due to the fact that some of high frequency signals inputted to the input terminal P1 shown in FIG. 6 bring about insertion losses of the high frequency switching element 50 can be alleviated during operation in the high gain mode.

Furthermore, inductance elements may be used instead of resistors 610, 611 and 612.

Fourth Embodiment

The fourth embodiment will now be described.

Figure 12:
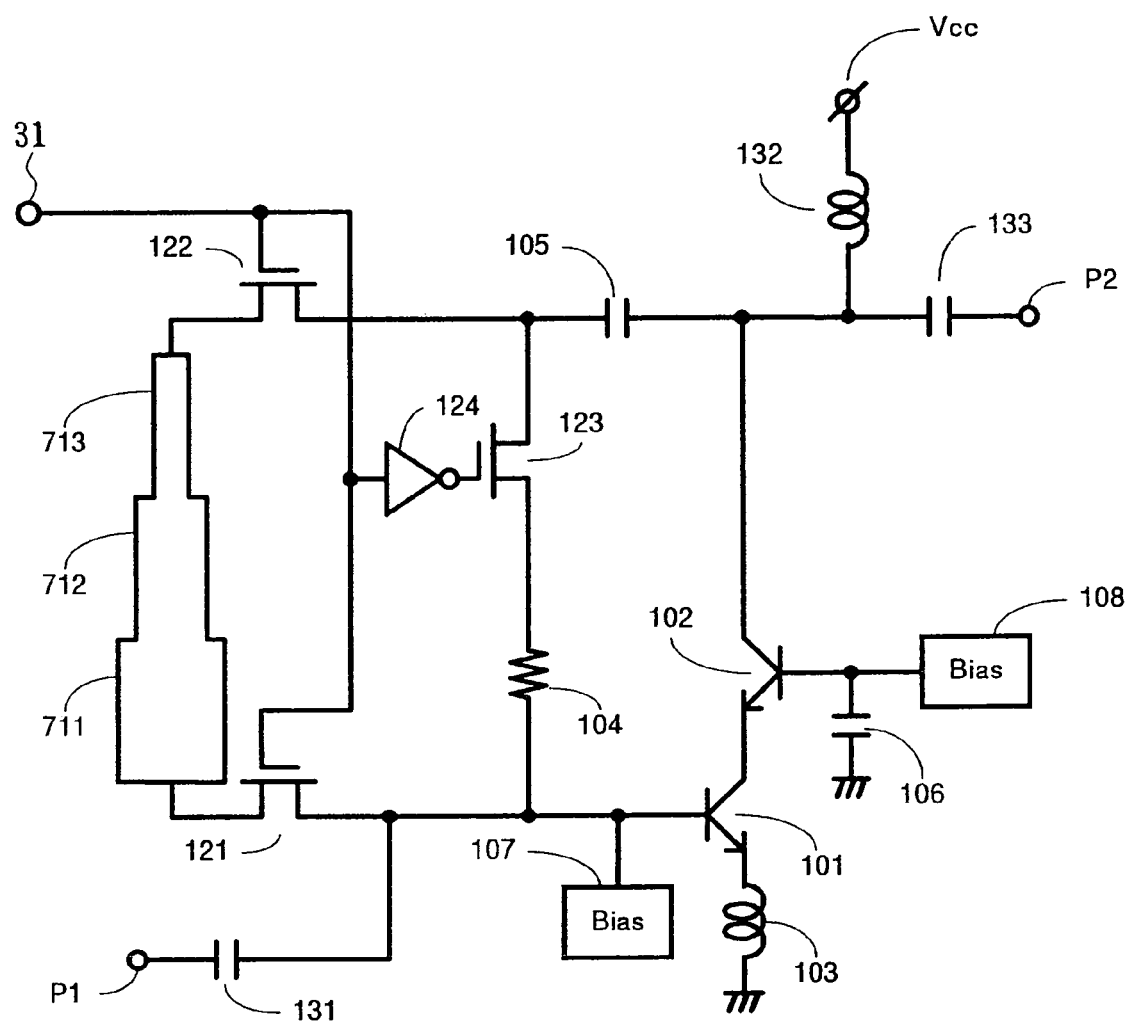
FIG. 12 is a circuit diagram of the variable gain amplifying apparatus using strip lines in the fourth embodiment of the present invention.

A circuit diagram of a variable gain amplifying apparatus 36 of the fourth embodiment is shown in FIG. 12.

For the variable gain amplifying apparatus 36 of this embodiment, the portion corresponding to the phase shifter 15 of FIG. 4 is constituted by strip lines.

Furthermore, the parts identical to those of the third embodiment are given same symbols, and descriptions thereof are not presented here.

For the variable gain amplifying apparatus 36 of the fourth embodiment, the passing phase of the receive signal in the case of the high gain mode is delayed, and the input impedance of the portion corresponding to the amplifier 13 is smaller than the output impedance of the same portion.

The variable gain amplifying apparatus 36 is different from the variable gain amplifying apparatus 33 in the portion corresponding to the phase shifter 15 of FIG. 4.

Specifically, the portion corresponding to the phase shifter 15 of FIG. 4 is comprised of strip lines 711, 712, 713. One of the strip line 711 is connected to one of the switching element 121, the other end of the strip line 711 is connected to one end of the strip line 712, and the other end of the strip line 712 is connected to one end of the strip line 713. The other end of the strip line 713 is connected to the switching element 122.

Also, the strip lines 711, 712, 713 are each made of aluminum wire. The strip limes 711, 712, 713 may be made of copper wire or gold wire.

The operation of this embodiment will now be described focusing on differences between itself and the third embodiment.

The circuit portion functioning as the phase shifter 15 of FIG. 4 adjusts the phase in the same way as the third embodiment.

Specifically, the ratio between the impedance value of the strip line 711 and the impedance value of the strip line 712 and the impedance value of the strip line 713 is $1:a:a^2$. Here, an adjustment is made so that the value of a equals a predetermined value larger than 1. That is, the value of a is previously designed so as to provide an amount of phase delay equal to the amount of delay of the phase of the receive signal outputted from the output terminal P2 relative to the phase of the receive signal inputted from the input terminal P1 in the case of high gain mode.

The circuit portion functioning as the phase shifter 15 of FIG. 4 has basic unit circuits, namely strip lines combined in three stages. The circuit portion functioning as the phase shifter 15 of FIG. 4 also plays a role as an impedance converter.

Provided that the impedance of the strip line 711 being a first-stage basic unit circuit equals Z1, and the input impedance of the base of the transistor 101 in the case of the high gain mode equals |Zi(high)|, the value of Z1 is selected so that the values of Z1 and |Zi(high)| are close to each other.

Provided that the impedance of the strip line 713 being a third-stage basic unit circuit equals Z3, and the output impedance of the collector of the transistor 102 equals |Zo(high)|, the value of Z3 is selected so that the values of Z3 and |Zo(high)| are close to each other.

In this way, the value of Z1 is selected so that the input impedance in the case of high gain mode is close to the input impedance in the case of low gain mode, and the value of Z3 is selected so that the output impedance in the case of high gain mode is close to the output impedance in the case of low gain mode.

Provided that the impedance of the strip line 712 being a second-stage basic unit circuit equals Z2, losses are kept at low levels in a relatively broad frequency range when Z1, Z2 and Z3 usually represent real numbers and satisfy the following equation 13.

$$Z2=(Z1\cdot Z3)^{1/2} \qquad \text{[Equation 13]}$$

Thus, the value of a is selected so that the following equation 14 is satisfied.

$$Z2=aZ1$$

$$Z3=a^2Z1 \qquad \text{[Equation 14]}$$

In addition, the number of stages is increased for extending the frequency range. In the case where the circuit portion functioning as the phase shifter 15 of FIG. 4 has basic unit circuits, namely strip lines combined in four stages, for example, losses are kept at low levels in a broader frequency range compared to the circuit portion having basic unit circuits combined in three stages if the value of a is selected so that the following equation 15 is satisfied, provided that Z1, Z2, Z3 and Z4 represent impedances of first to fourth-stage basic unit circuits, respectively.

$$Z2 = aZ1$$

$$Z3 = a^2 Z2$$

$$Z4 = a^3 Z3 \quad \text{[Equation 15]}$$

Generally, in the case where the circuit portion has basic unit circuits combined in n stages (n is an integer number equal to or greater than 1), the value of a is selected so that the following equation 16 is satisfied.

$$Z_{i+1} = a^i Z_i \quad \text{[Equation 16]}$$

wherein i is any integer number in the range of from 1 to n−1.

In a similar way, the circuit portion functioning as the phase shifter 15 of FIG. 4 is constituted by one strip line with its line width continuously changed, and the impedance of the input side of the strip line is given the value of Z1 when the circuit portion has basic unit circuits combined in three stages, and the impedance of the output side of the strip line is given the value of Z3 when the circuit portion has basic unit circuits combined in three stages.

Phase adjustment can be achieved by changing the overall length of the strip line.

In the case where the strip lines 711, 712 and 713 are formed as micro strip lines, the impedances of strip lines 711, 712 and 713 can be determined in the same way as the above strip lines 711, 712 and 713 by pursuing the following procedure.

Figure 24:
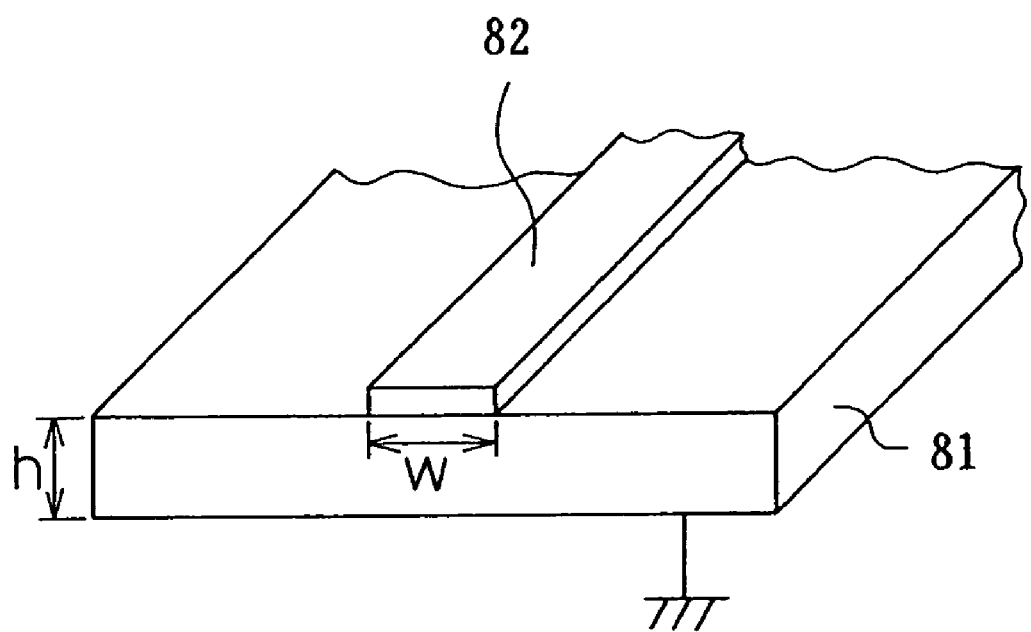
FIG. 24 is a block diagram of micro strip lines.

Specifically, a micro strip line 82 constituting a basic unit circuit is shown in FIG. 24. The micro strip line 82 is formed on a dielectric 81, and no dielectric is formed on the side opposite to the dielectric 81 in the micro strip line 82. Assume that the width of the micro strip line 82 is w, the height of the dielectric 81 is h, and the permittivity of the dielectric 81 is $\in_r$. In this case, if w/h is equal to or smaller than 1, the impedance $Z_0$ of the strip line 82 can be approximated as is found in the following equation 17.

$$Z_O = \frac{120\pi}{2\pi\sqrt{\varepsilon_{re}}} \ln\left(\frac{8h}{w} + 0.25\frac{w}{h}\right)$$

If w/h is equal to or larger than 1, the impedance $Z_0$ of the strip line 82 can be approximated as is found in the following equation 18.

$$Z_O = \frac{120\pi}{2\pi\sqrt{\varepsilon_{re}}} \left[\frac{w}{h} + 1.393 + 0.667 \ln\left(\frac{w}{h} + 1.444\right)\right]^{-1}$$

wherein $\in_{re}$ is given by the following equation 19.

$$\varepsilon_{re} = \frac{\varepsilon r + 1}{2} + \frac{\varepsilon r - 1}{2}\left(1 + 10\frac{h}{w}\right)^{-\frac{1}{2}}$$

Thus, by adjusting the width w of the micro strip line 82 and the like, basic unit circuits allowing the equation 16 to be satisfied, for example, can be obtained.

Thus, by passing through this circuit portion, a signal of which amount of phase delay is substantially equal to the amount of delay of the passing phase in the case of high gain mode is outputted from the output terminal P2.

In this way, even if the passing phase of the receive signal in the case of the high gain mode is delayed, and the input impedance of the portion corresponding to the amplifier 13 is smaller than the output impedance of the same portion, it is possible to sufficiently alleviate the situation in which the phase of the signal outputted from the output terminal P2 is shifted in a discontinuous manner when switching is done from the high gain mode to the low gain mode, or from the low gain mode to the high gain mode.

Furthermore, for the variable gain amplifying apparatus 36 of FIG. 12, the impedance is changed using the strip lines 711, 712 and 713 having different line widths, but the impedance may be changed using dielectrics of different relative permittivities or different thicknesses.

Furthermore, instead of the strip lines 711, 712 and 713, a line having a taper in which characteristic impedance varies in the range of from Z1 to Z4 may be used.

Furthermore, the variable gain amplifying apparatus 36 of this embodiment may have a configuration in which the switching elements 121, 122, 123 take on 0 potentials at least at one ends as in the case of the variable gain amplifying apparatus 30 of the third embodiment. Thereby, the switching elements are reliably enabled/disabled, and the insertion loss when the switching elements are enabled is improved.

Furthermore, the variable gain amplifying apparatus 36 may also be comprised of balanced circuits as described in the third embodiment.

If the input impedance of the portion corresponding to the amplifier 13 is larger than the output impedance of the same portion, and the passing phase of the receive signal is delayed, a same degree of effectiveness as that of this embodiment can be attained by changing the circuit portion corresponding to the phase shifter 15 of FIG. 4 as described below.

Figure 13:
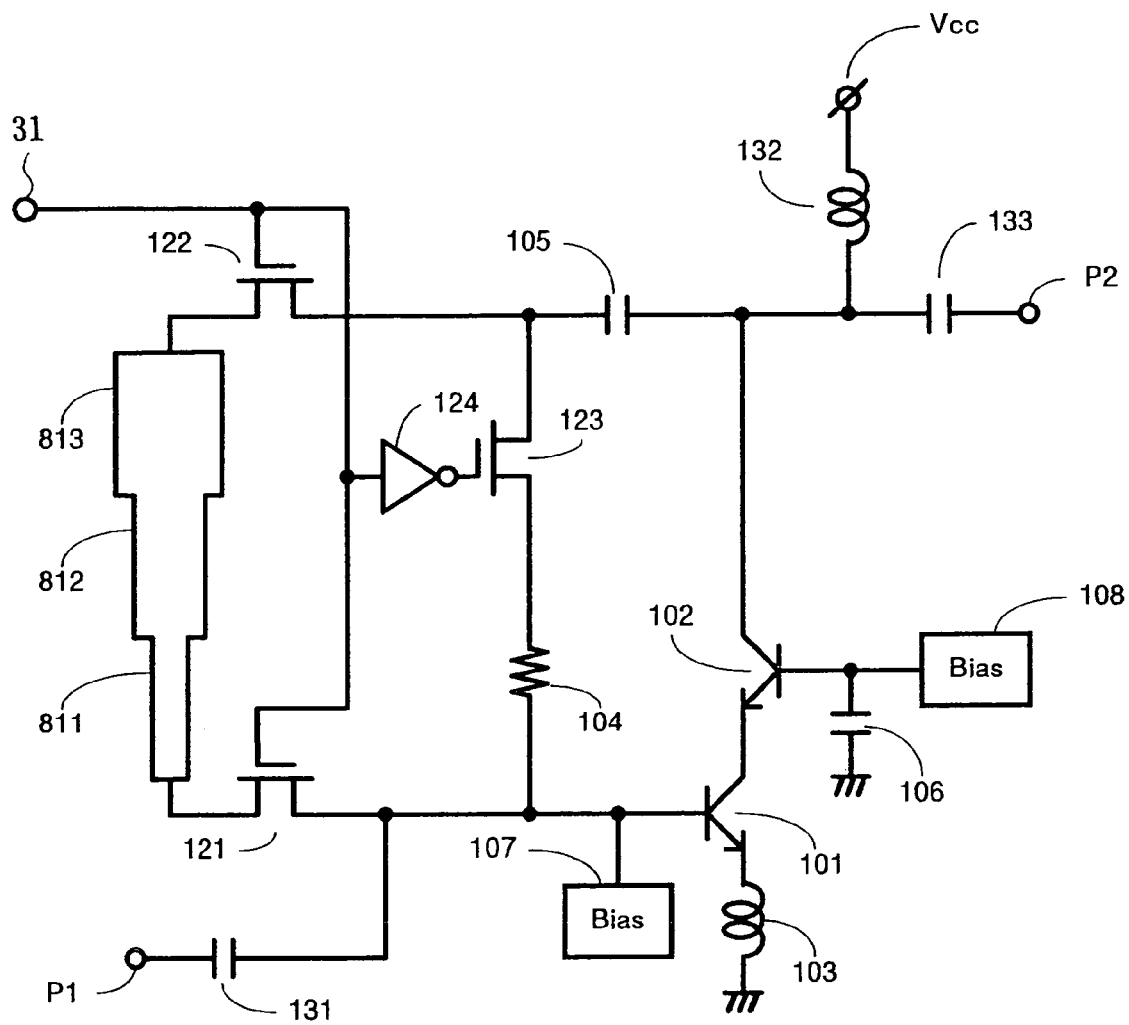
FIG. 13 is a circuit diagram of the variable gain amplifying apparatus with another configuration using strip lines in the fourth embodiment of the present invention.

That is, for the variable gain amplifying apparatus 37 of FIG. 13, the passing phase of the receive signal in the case of high gain mode is delayed, and the input impedance of the portion corresponding to the amplifier 13 is larger than the output impedance of the same portion.

The portion corresponding to the phase shifter 15 of FIG. 4 is comprised of strip lines 811, 812, 813. One end of the strip line 811 is connected to one end of the switching element 121, the other end of the strip line 811 is connected to one end of the strip line 812, and the other end of the strip line 812 is connected to one end of the strip line 813. The other end of the strip line 813 is connected to the switching element 122.

This circuit portion adjusts the phase in the same way as the third embodiment.

Specifically, the ratio between the impedance value of the strip line 811 and the impedance value of the strip line 812 and the impedance value of the strip line 813 is 1:a:a². Here, an adjustment is made so that the value of a equals a predetermined value smaller than 1. That is, the value of a is previously designed so as to provide an amount of phase delay equal to the amount of delay of the phase of the receive signal outputted from the output terminal P2 relative to the phase of the receive signal inputted from the input terminal P1 in the case of high gain mode. The value of a can be determined in the same way as described above.

Thus, by passing through this circuit portion, a signal of which amount of phase delay is substantially equal to the amount of delay of the passing phase in the case of high gain mode is outputted from the output terminal P2.

In this way, even if the passing phase of the receive signal in the case of the high gain mode is delayed, and the input impedance of the portion corresponding to the amplifier 13 is larger than the output impedance of the same portion, it is possible to sufficiently alleviate the situation in which the phase of the signal outputted from the output terminal P2 is shifted in a discontinuous manner when switching is done from the high gain mode to the low gain mode, or from the low gain mode to the high gain mode.

Furthermore, instead of the strip lines 811, 812 and 813, a line having a taper in which characteristic impedance varies in the range of from Z1 to Z4 may be used.

Furthermore, the variable gain amplifying apparatus 37 of this embodiment may have a configuration in which the switching elements 121, 122, 123 take on 0 potentials at least at one ends as in the case of the variable gain amplifying apparatus 30 of the third embodiment. Thereby, the switching elements are reliably enabled/disabled, and the insertion loss when the switching elements are enabled is improved.

Furthermore, the variable gain amplifying apparatus 37 may also be comprised of balanced circuits as described in the third embodiment.

Fifth Embodiment

The fifth embodiment will now be described.

Figure 14:
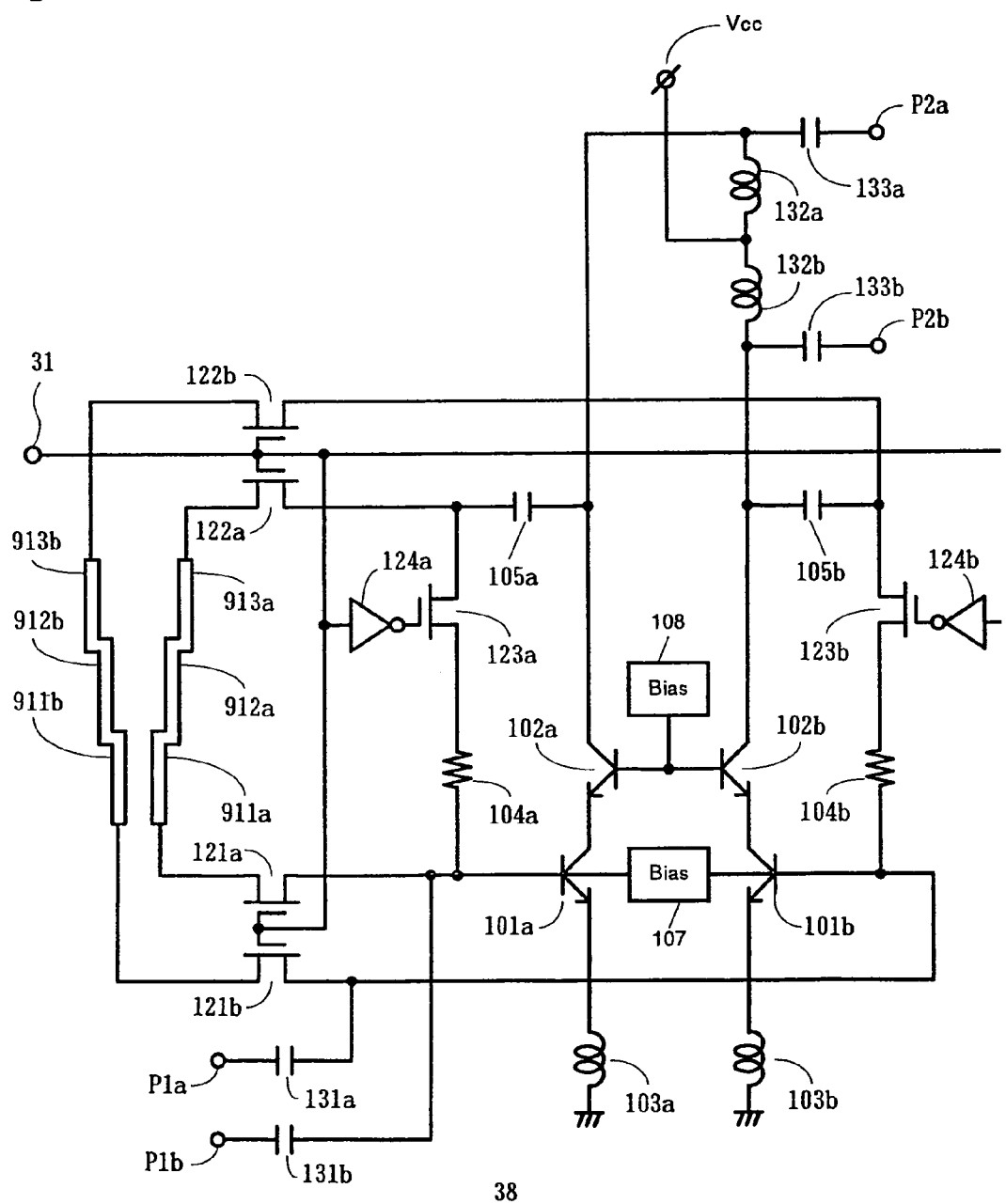
FIG. 14 is a circuit diagram of the variable gain amplifying apparatus using parallel twin lines in the fifth embodiment of the present invention.

A circuit diagram of a variable gain amplifying apparatus 38 of the fifth embodiment is shown in FIG. 14.

For the variable gain amplifying apparatus 38 of this embodiment, the portion corresponding to the phase shifter 15 of FIG. 4 is constituted by parallel twin lines.

The variable gain amplifying apparatus 38 is a variable gain amplifying apparatus in which the portion corresponding to the phase shifter 15 of the balanced variable gain amplifying apparatus 32 of the third embodiment is replaced by parallel twin lines.

In this way, the variable gain amplifying apparatus 38 of this embodiment has balanced circuits.

Furthermore, the parts identical to those of the third embodiment are given same symbols and descriptions thereof are not presented here.

For the variable gain amplifying apparatus 38, the passing phase of the receive signal in the case of high gain mode is delayed, and the input impedance of the portion corresponding to the amplifier 13 is smaller than the output impedance of the same portion.

The portion corresponding to the phase shifter 15 of FIG. 4 in the variable gain amplifying apparatus 38 is comprised of parallel twin lines 911a, 911b, parallel twin lines 912a, 912b, and parallel twin lines 913a, 913b. One ends of the parallel twin lines 911a and 911b are connected to the switching elements 121a and 121b, respectively, and the other ends of the parallel twin lines 911a and 911a are connected to one ends of the parallel twin lines 912a and 912b, respectively. The other ends of the parallel twin lines 912a and 912b are connected to one ends of the parallel twin lines 913a and 913b, respectively. The other ends of the parallel twin lines 913a and 913b are connected to the switching elements 122a and 122b, respectively.

The parallel twin lines 911a, 911b, the parallel twin lines 912a, 912b, and the parallel twin lines 913a, 913b are each made of aluminum wire. Furthermore, the parallel twin lines 911a, 911b, the parallel twin lines 912a, 912b, and the parallel twin lines 913a, 913b may be made of copper wire or gold wire.

The operation of this embodiment will now be described focusing on differences between itself and the third embodiment.

The circuit portion functioning as the phase shifter 15 of FIG. 4 adjusts the phase in the same way as the third embodiment.

Specifically, the ratio between the distance between the parallel twin lines 911a and 911b and the distance between the parallel twin lines 912a and 912b and the distance between the parallel twin lines 913a and 913b is $1:a:a^2$. Here, an adjustment is made so that the value of a equals a predetermined value smaller than 1. That is, the value of a is previously designed so as to provide amounts of phase delay equal to the amounts of delay of the phases of the receive signals outputted from output terminals P2a and P2b relative to the phases of the receive signals inputted from input terminals P1a and P1b in the case of high gain mode.

For the parallel twin lines, input/output impedances are determined depending on the line width, and therefore the value of a can be determined in the same way as the strip line described in the fourth embodiment.

Thus, by passing through this circuit portion, signals of which amounts of phase delay are substantially equal to the amount of delay of the passing phase in the case of high gain mode are outputted from the output terminals P2a and P2b.

In this way, even if the passing phase of the receive signal in the case of the high gain mode is delayed, and the input impedance of the portion corresponding to the amplifier 13 is smaller than the output impedance of the same portion, it is possible to sufficiently alleviate the situation in which the phases of the signals outputted from the output terminals P2a and P2b are shifted in a discontinuous manner when switching is done from the high gain mode to the low gain mode, or from the low gain mode to the high gain mode.

Furthermore, instead of the parallel twin lines, 911a and 911b, 912a and 912b, and 913a and 913b, two lines with the line width gradually changed so that the ratio of width lines for input and output is $1:a^2$ may be used.

Furthermore, the variable gain amplifying apparatus 38 of this embodiment may have a configuration in which the switching elements 121, 122, 123 take on 0 potentials at least at one ends as in the case of the variable gain amplifying apparatus 30 of the third embodiment. Thereby, the switching elements are reliably enabled/disabled, and the insertion loss when the switching elements are enabled is improved.

If the input impedance of the portion corresponding to the amplifier 13 is larger than the output impedance of the same portion, and the passing phase of the receive signal is delayed, a same degree of effectiveness as that of this embodiment can be attained by changing the circuit portion corresponding to the phase shifter 15 of FIG. 4 as described below.

Figure 15:
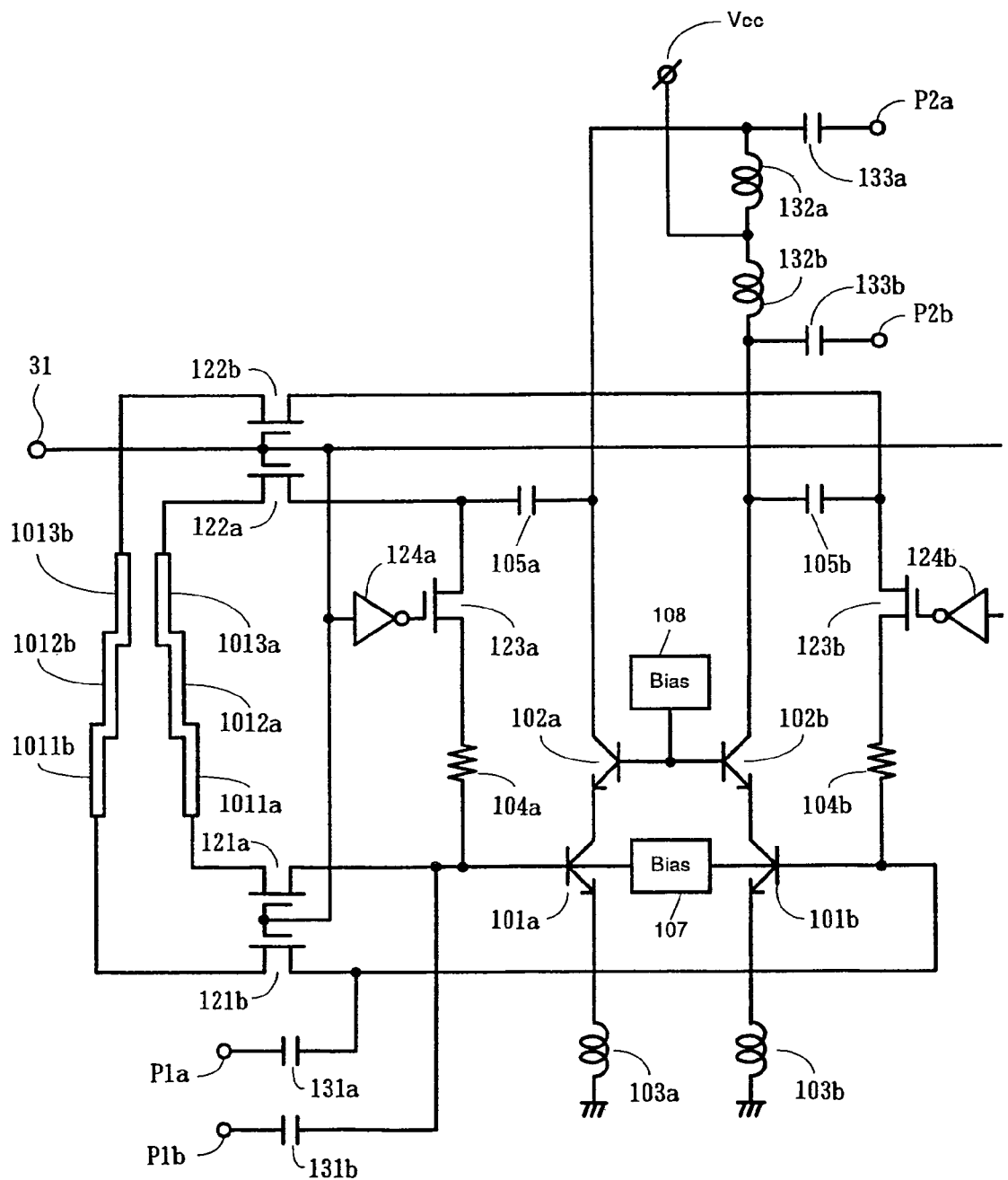
FIG. 15 is a circuit diagram of the variable gain amplifying apparatus with another configuration using parallel twin lines in the fifth embodiment of the present invention.

That is, for the variable gain amplifying apparatus 39 of FIG. 15, the passing phase of the receive signal in the case of high gain mode is delayed, and the input impedance of the portion corresponding to the amplifier 13 of FIG. 4 is larger than the output impedance of the same portion.

The portion corresponding to the phase shifter 15 of FIG. 4 in the variable gain amplifying apparatus 39 is comprised of parallel twin lines 1011a, 1011b, parallel twin lines 1012a, 1012b, and parallel twin lines 1013a, 1013b. One ends of the parallel twin lines 1011a and 1011b are connected to the switching elements 121a and 121b, respectively, and the other ends of the parallel twin lines 1011a and 1011a are connected to one ends of the parallel twin lines 1012a and 1012b, respectively. The other ends of the parallel twin lines 1012a and 1012b are connected to one ends of the parallel twin lines 1013a and 1013b, respectively. The other ends of the parallel twin lines 1013a and 1013b are connected to the switching elements 122a and 122b, respectively.

This circuit portion adjusts the phase in the same way as the third embodiment.

Specifically, the ratio between the distance between the parallel twin lines 1011a and 1011b and the distance between the parallel twin lines 1012a and 1012b and the distance between the parallel twin lines 1013a and 1013b is $1:a:a^2$. Here, an adjustment is made so that the value of a equals a predetermined value larger than 1. That is, the value of a is previously designed so as to provide amounts of phase delay equal to the amounts of delay of the phases of the receive signals outputted from output terminals P2a and P2b relative to the phases of the receive signals inputted from input terminals P1a and P1b in the case of high gain mode. For the parallel twin lines, input/output impedances are determined depending on the line width, and therefore the value of a can be determined in the same way as the strip line described in the fourth embodiment.

Thus, by passing through this circuit portion, signals of which amounts of phase delay are substantially equal to the amount of delay of the passing phase in the case of high gain mode are outputted from the output terminals P2a and P2b.

In this way, even if the passing phase of the receive signal in the case of the high gain mode is delayed, and the input impedance of the portion corresponding to the amplifier 13 is larger than the output impedance of the same portion, it is possible to sufficiently alleviate the situation in which the phases of the signals outputted from the output terminals P2a and P2b are shifted in a discontinuous manner when switching is done from the high gain mode to the low gain mode, or from the low gain mode to the high gain mode.

Furthermore, instead of the parallel twin lines, 1011a and 1011b, 1012a and 1012b, and 1013a and 1013b, two lines with the line width gradually changed so that the ratio of width lines for input and output is $1:a^2$ may be used.

Furthermore, the variable gain amplifying apparatus 39 of this embodiment may have a configuration in which the switching elements 121, 122, 123 take on 0 potentials at least at one ends as in the case of the variable gain amplifying apparatus 30 of the third embodiment. Thereby, the switching elements are reliably enabled/disabled, and the insertion loss when the switching elements are enabled is improved.

Sixth Embodiment

The sixth embodiment will now be described.

Figure 16:
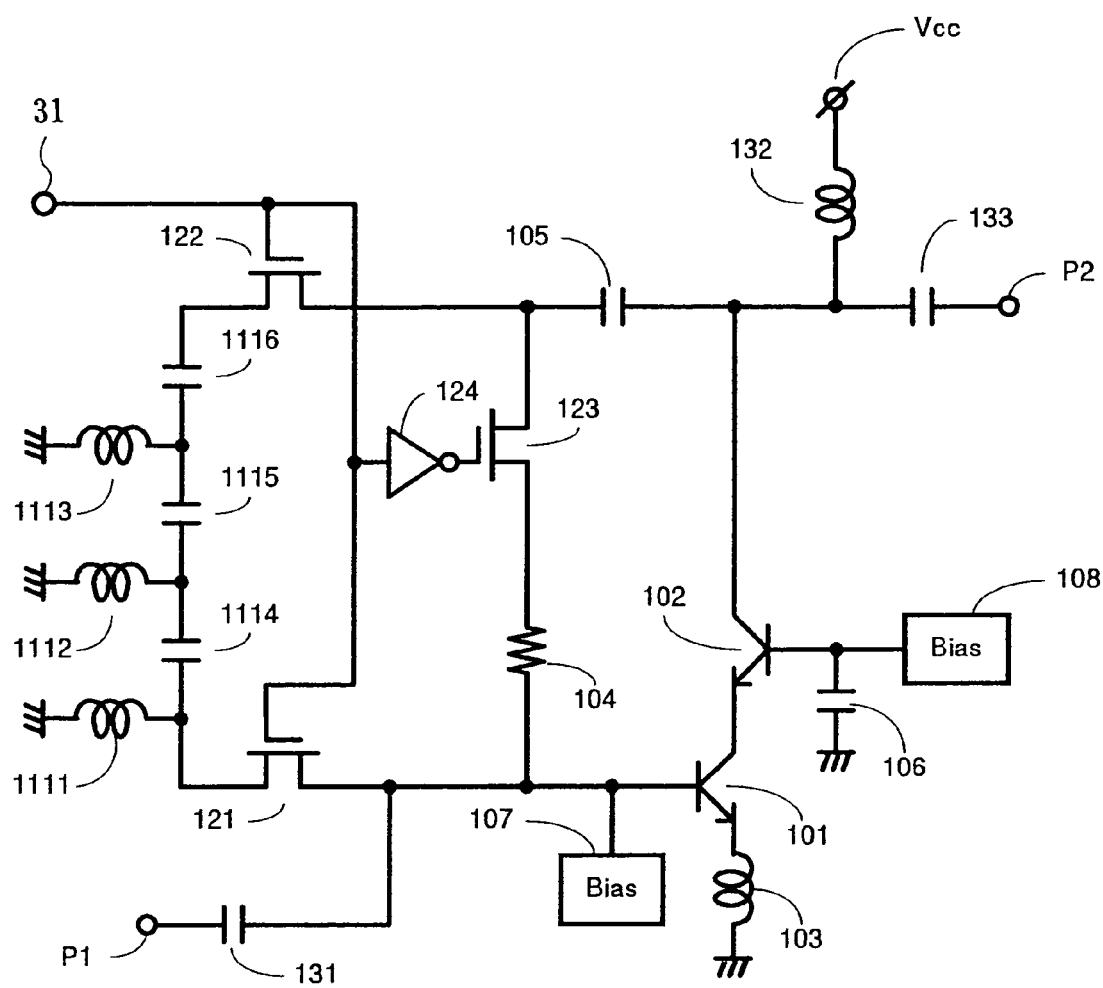
FIG. 16 is a circuit diagram of the variable gain amplifying apparatus in the sixth embodiment of the present invention.

A circuit diagram of a variable gain amplifying apparatus 40 of the sixth embodiment is shown in FIG. 16.

For the variable gain amplifying apparatus 40 of this embodiment, the portion corresponding to the phase shifter 15 of FIG. 4 is constituted by capacitors and inductors.

Furthermore, the parts identical to those of the third embodiment are given same symbols and descriptions thereof are not presented here.

For the variable gain amplifying apparatus 40 of this embodiment, the passing phase of the receive signal in the case of high mode is advanced, and the input impedance of the portion corresponding to the amplifier 13 is smaller than the output impedance of the same portion.

The variable gain amplifying apparatus 40 is different from the variable gain amplifying apparatus 33 in the portion corresponding to the phase shifter 15 of FIG. 4.

Specifically, the portion corresponding to the phase shifter 15 of FIG. 4 is comprised of capacitors 1114, 1115, 1116 and inductors 1111, 1112, 1113. For the variable gain amplifying apparatus 40, the passing phase of the receive signal in the case of high gain mode is advanced, and the input impedance of the portion corresponding to the amplifier 13 is smaller than the output impedance of the same portion.

For the portion corresponding to the phase shifter 15 of FIG. 4 in the variable gain amplifying apparatus 40, one end of the capacitor 1114 is connected to one end of the switching element 121, and the grounded inductor 1111 is connected to one end of the capacitor 1114. The other end of the capacitor 1114 is connected to the grounded inductor 1112 and to one end of the capacitor 1115. The other end of the capacitor 1115 is connected to the grounded inductor 1112 and to one end of the capacitor 1116. One end of the switching element 122 is connected to the other end of the capacitor 1116.

Furthermore, the inductors 1111, 1112, 1113 are made of aluminum wire, the capacitors 1114, 1115, 1116 are composed of MOS capacitors, and the wiring connecting the capacitor to the inductor is made of gold wire. Furthermore, the inductors 1111, 1112, 1113 may be made of copper wire, and the capacitors 1114, 1115, 1116 may be composed of MIM capacitors.

The operation of this embodiment will now be described focusing on differences between itself and the third embodiment.

The circuit portion functioning as the phase shifter 15 of FIG. 4 in the variable gain amplifying apparatus 40 adjusts the phase in the same way as the third embodiment.

Specifically, the ratio between the inductance value of the inductor 1111 and the inductance value of the inductor 1112 and the inductance value of the inductor 1113 is $1:a:a^2$. The ratio between the capacitance value of the capacitor 1114 and the capacitance value of the capacitor 1115 and the capacitance value of the capacitor 1116 is $a^2:a:1$. Here, an adjustment is made so that the value of a equals a predetermined value larger than 1. That is, the value of a is previously adjusted so as to provide an amount of phase advance equal to the amount of advance of the phase of the receive signal outputted from the output terminal P2 relative to the phase of the receive signal inputted from the input terminal P1 in the case of high gain mode. The value of a is determined in the same way as the method of the determining the value of a described in the third embodiment except that the resistor is replaced by the inductor. Because the inductor is used in stead of the resistor of the third embodiment, the level of passing loss is reduced compared to the third embodiment.

Thus, by passing through this circuit portion, a receive signal of which amount of phase delay is substantially equal to the amount of delay of the passing phase in the case of high gain mode is outputted from the output terminal P2.

In this way, even if the passing phase of the receive signal in the case of high gain mode is advanced, and the input impedance of the portion corresponding to the amplifier 13 is smaller than the output impedance of the same portion, it is possible to sufficiently alleviate the situation in which the phase of the signal outputted from the output terminal P2 is shifted in a discontinuous manner when switching is done from the high gain mode to the low gain mode, or from the low gain mode to the high gain mode.

Furthermore, the variable gain amplifying apparatus 40 of this embodiment may have a configuration in which the switching elements 121, 122, 123 take on 0 potentials at least at one ends as in the case of the variable gain amplifying apparatus 30 of the third embodiment. Thereby, the switching elements are reliably enabled/disabled, and the insertion loss when the switching elements are enabled is improved.

Furthermore, the variable gain amplifying apparatus 40 of this embodiment has been described as an unbalanced circuit, but may also be achieved as a balanced circuit.

Figure 17:
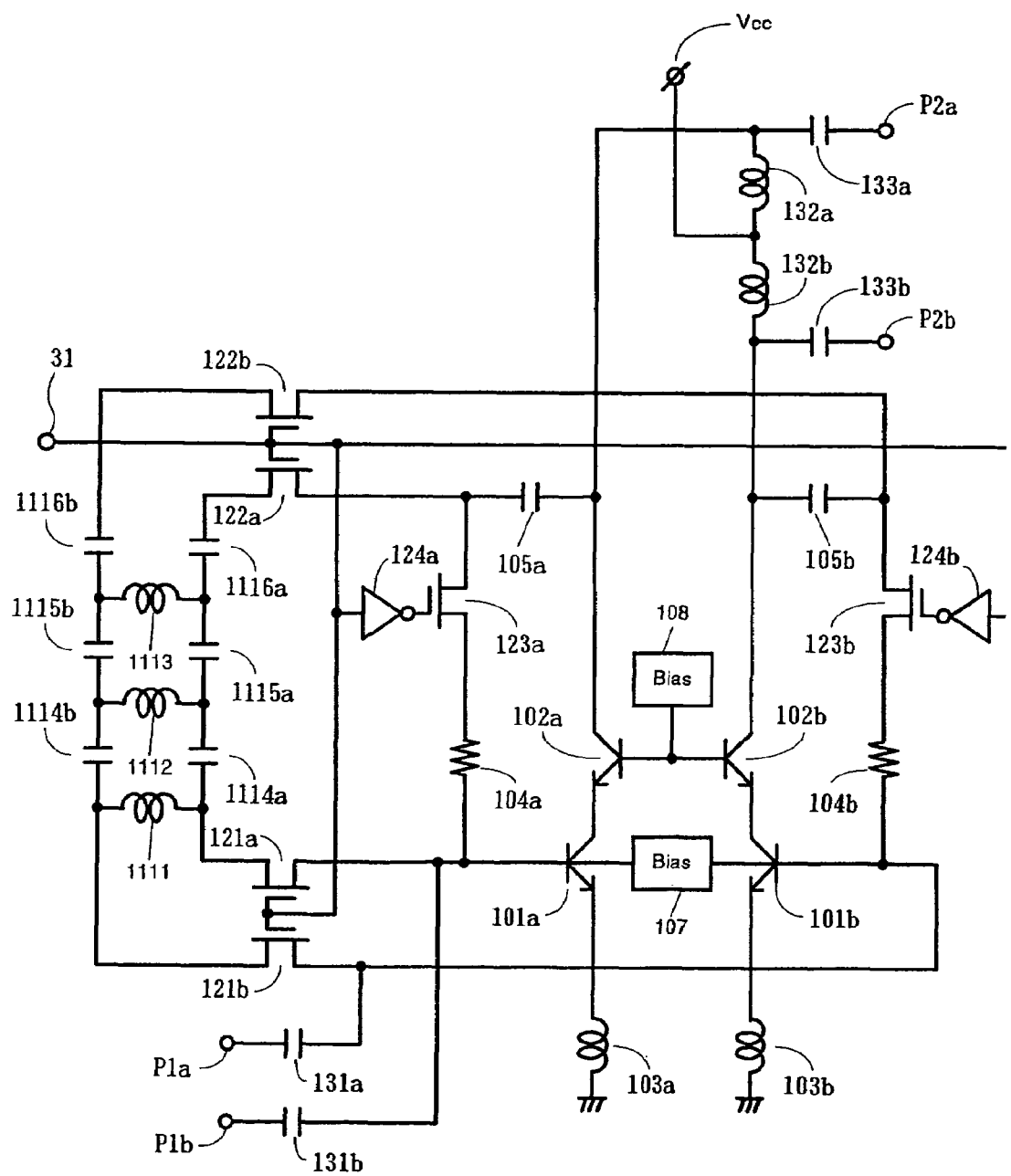
FIG. 17 is a circuit diagram of the variable gain amplifying apparatus constituted by balanced circuits in the sixth embodiment of the present invention.

That is, a variable gain amplifying apparatus 41 achieved as a balanced circuit by modifying the variable gain amplifying apparatus 40 of this embodiment is shown in FIG. 17.

For the variable gain amplifying apparatus 41 of FIG. 17, the portion corresponding to the phase shifter 15 of the variable gain amplifying apparatus 32 of the third embodiment is replaced by capacitors 1114a, 1114b, 1115a, 1115b, 1116a, 1116b, and inductors 1111, 1112, 1113. As for other aspects, the variable gain amplifying apparatus 41 is same as the third embodiment.

In this way, use of the variable gain amplifying apparatus 41 having balanced circuits makes it possible to attain a same degree of effectiveness as that of this embodiment.

Furthermore, in the variable gain amplifying apparatus 40 of FIG. 17, when the variable gain amplifying apparatus is used in the high gain mode, the receive signal is passed through the circuit portion corresponding to the amplifier 13 of FIG. 4, whereby the phase of the receive signal outputted from the output terminal P2 is advanced farther than the phase of the receive signal inputted to the input terminal P1, and the input impedance to the base of the transistor 101 is smaller than the output impedance of the collector of the transistor 102, but the circuit portion corresponding to the phase shifter 15 of FIG. 4 should be changed if the circuit portion corresponding to the amplifier 13 of FIG. 4 has a characteristic other than that described above.

Figure 18:
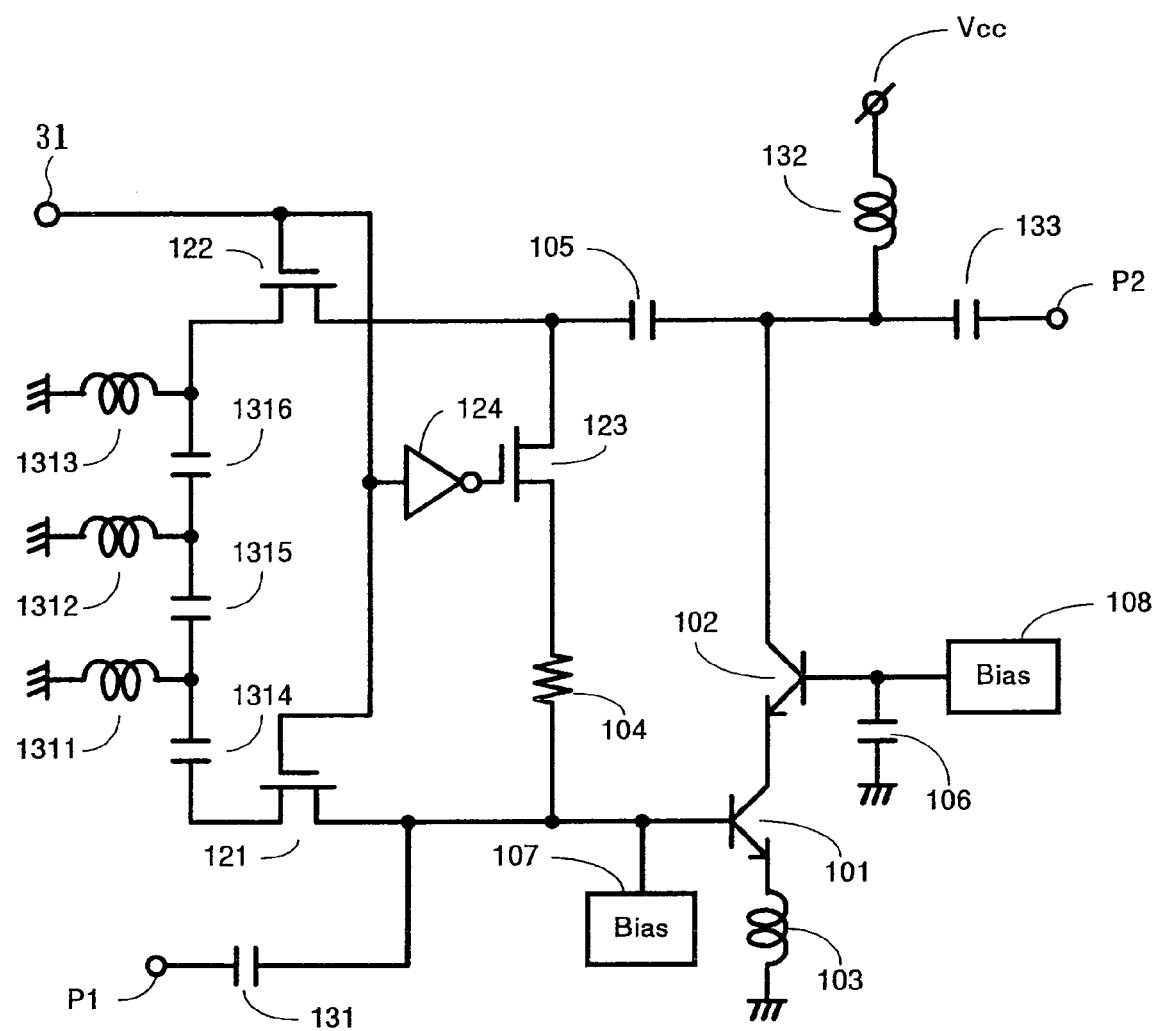
FIG. 18 is a circuit diagram of the variable gain amplifying apparatus with another configuration in the sixth embodiment of the present invention.

First, a circuit diagram of a variable gain amplifying apparatus 42 in which the circuit portion corresponding to the phase shifter 15 is changed is shown in FIG. 18. For the variable gain amplifying apparatus 42, the passing phase in the high gain mode is advanced, and the input impedance of the portion corresponding to the amplifier 13 is larger than the output impedance of the same portion.

For the portion corresponding to the phase shifter 15 of FIG. 4 in the variable gain amplifying apparatus 42, one end of a capacitor 1314 is connected to one end of the switching element 121, and the other end of the capacitor 1314 is connected to a grounded inductor 1311 and to one end of a capacitor 1315. The other end of the capacitor 1315 is connected to a grounded inductor 1312 and to one end of a capacitor 1316. The other end of the capacitor 1316 is connected to a grounded inductor 1313 and to one end of the switching element 122.

The circuit portion functioning as the phase shifter 15 of FIG. 4 in the variable gain amplifying apparatus 42 adjusts the phase in the same way as the third embodiment.

Specifically, the ratio between the inductance value of the inductor 1311 and the inductance value of the inductor 1312 and the inductance value of the inductor 1313 is $1:a:a^2$. The ratio between the capacitance value of the capacitor 1314 and the capacitance value of the capacitor 1315 and the capacitance value of the capacitor 1316 is $a^2:a:1$. Here, an adjustment is made so that the value of a equals a predetermined value smaller than 1. That is, the value of a is previously designed so as to provide an amount of phase advance equal to the amount of advance of the phase of the receive signal outputted from the output terminal P2 relative to the phase of the receive signal inputted from the input terminal P1 in the case of high gain mode. The value of a is determined in the same way as the method of the determining the value of a described in the third embodiment except that the resistor is replaced by the inductor. Because the inductor is used in stead of the resistor of the third embodiment, the level of passing loss is reduced compared to the third embodiment.

Thus, by passing through this circuit portion, a receive signal of which amount of phase advance is substantially equal to the amount of advance of the passing phase in the case of high gain mode is outputted from the output terminal P2.

In this way, even if the passing phase of the receive signal in the case of high gain mode is advanced, and the input impedance of the portion corresponding to the amplifier 13 is larger than the output impedance of the same portion, it is possible to sufficiently alleviate the situation in which the phase of the signal outputted from the output terminal P2 is shifted in a discontinuous manner when switching is done from the high gain mode to the low gain mode, or from the low gain mode to the high gain mode.

Furthermore, the variable gain amplifying apparatus 42 of this embodiment may have a configuration in which the switching elements 121, 122, 123 take on 0 potentials at least at one ends as in the case of the variable gain amplifying apparatus 30 of the third embodiment. Thereby, the switching elements are reliably enabled/disabled, and the insertion loss when the switching elements are enabled is improved.

Furthermore, the variable gain amplifying apparatus 42 of this embodiment may also be constituted by balanced circuits as described in this embodiment.

Figure 19:
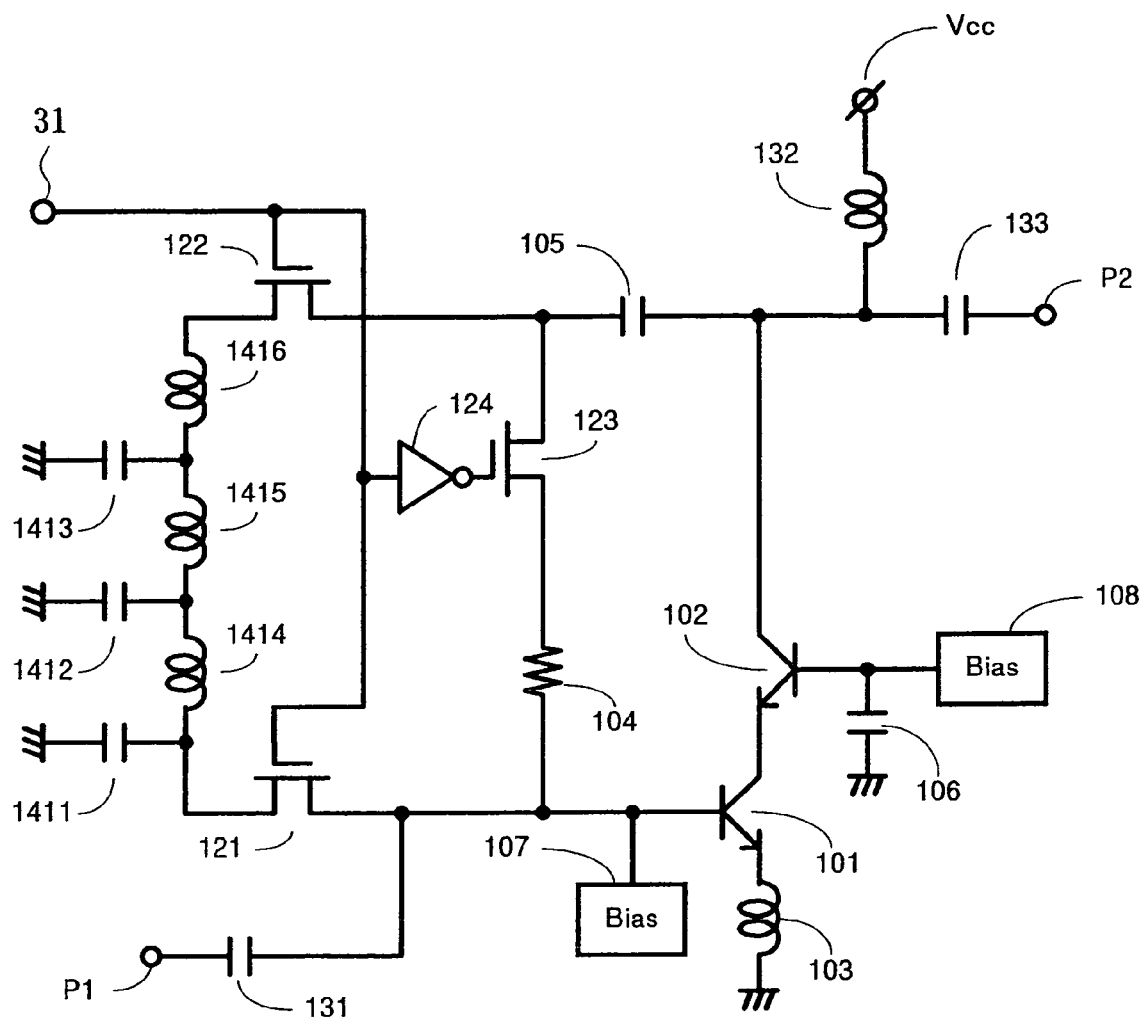
FIG. 19 is a circuit diagram of the variable gain amplifying apparatus with another configuration in the sixth embodiment of the present invention.

A circuit diagram of another variable gain amplifying apparatus 43 in which the circuit portion corresponding to the phase shifter 15 is changed is shown in FIG. 19. For the variable gain amplifying apparatus 43 of FIG. 19, the passing phase of the receive signal is delayed in the case of high gain mode, and the input impedance of the portion corresponding to the amplifier 13 is smaller than the output impedance of the same portion.

Specifically, for the portion corresponding to the phase shifter 15 of FIG. 4, one end of an inductor 1414 is connected to one end of the switching element 121, a grounded capacitor 1411 is connected to one end of the inductor 1414, and the other end of the inductor 1414 is connected to one end of an inductor 1415 and to a grounded capacitor 1412. A grounded capacitor 1413 is connected to the other end of the inductor 1415, and the other end of the inductor 1415 is connected to one end of an inductor 1416. One end of the switching element 122 is connected to the other end of the inductor 1416.

The circuit portion functioning as the phase shifter 15 of FIG. 4 adjusts the phase in the same way as this embodiment.

Specifically, the ratio between the inductance value of the inductor 1414 and the inductance value of the inductor 1415 and the inductance value of the inductor 1416 is $1:a:a^2$. The ratio between the capacitance value of the capacitor 1411 and the capacitance value of the capacitor 1412 and the capacitance value of the capacitor 1413 is $a^2:a:1$. Here, an adjustment is made so that the value of a equals a predetermined value larger than 1. That is, the value of a is previously designed so as to provide an amount of phase delay equal to the amount of delay of the phase of the receive signal outputted from the output terminal P2 relative to the phase of the receive signal inputted from the input terminal P1 in the case of high gain mode. The value of a is determined in the same way as the method of the determining the value of a described in the third embodiment except that the resistor is replaced by the inductor. Because the inductor is used instead of the resistor of the third embodiment, the level of passing loss is reduced compared to the third embodiment.

Thus, by passing through this circuit portion, a receive signal of which amount of phase delay is substantially equal to the amount of delay of the passing phase in the case of high gain mode is outputted from the output terminal P2.

In this way, even if the passing phase of the receive signal in the case of high gain mode is delayed, and the input impedance of the portion corresponding to the amplifier 13 is smaller than the output impedance of the same portion, it is possible to sufficiently alleviate the situation in which the phase of the signal outputted from the output terminal P2 is shifted in a discontinuous manner when switching is done from the high gain mode to the low gain mode, or from the low gain mode to the high gain mode.

Furthermore, the variable gain amplifying apparatus 43 of this embodiment may have a configuration in which the switching elements 121, 122, 123 take on 0 potentials at least at one ends as in the case of the variable gain amplifying apparatus 30 of the third embodiment. Thereby, the switching elements are reliably enabled/disabled, and the insertion loss when the switching elements are enabled is improved.

Furthermore, the variable gain amplifying apparatus 43 of this embodiment may also be constituted by balanced circuits as described in this embodiment.

Figure 20:
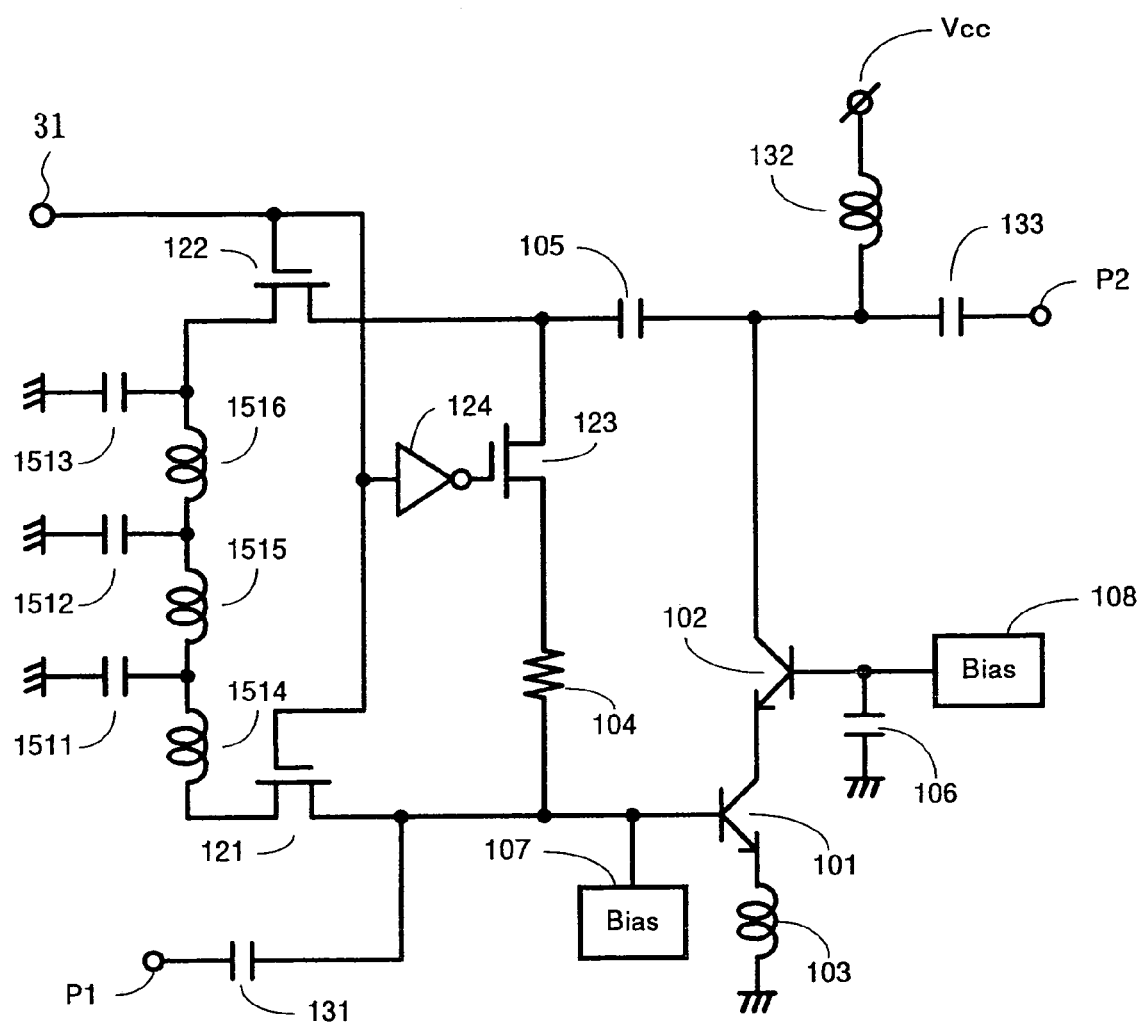
FIG. 20 is a circuit diagram of the variable gain amplifying apparatus with another configuration in the sixth embodiment of the present invention.

A circuit diagram of another variable gain amplifying apparatus 44 in which the circuit portion corresponding to the phase shifter 15 is changed is shown in FIG. 20. For the variable gain amplifying apparatus 44 of FIG. 65, the passing phase of the receive signal is delayed in the case of high gain mode, and the input impedance of the portion corresponding to the amplifier 13 is larger than the output impedance of the same portion.

For the portion corresponding to the phase shifter 15 of FIG. 4, one end of an inductor 1514 is connected to one end of the switching element 121, a grounded capacitor 1511 is connected to the other end of the inductor 1514, and one end of an inductor 1515 is connected to the other end of the inductor 1514. A grounded capacitor 1512 is connected to the other end of the inductor 1515, and the other end of the inductor 1515 is connected to one end of an inductor 1516. A grounded capacitor 1513 is connected to the other end of the inductor 1516, and one end of the switching element 122 is connected to the other end of the inductor 1516.

The circuit portion functioning as the phase shifter 15 of FIG. 4 adjusts the phase in the same way as this embodiment.

Specifically, the ratio between the inductance value of the inductor 1514 and the inductance value of the inductor 1515 and the inductance value of the inductor 1516 is $1:a:a^2$. The ratio between the capacitance value of the capacitor 1511 and the capacitance value of the capacitor 1512 and the capacitance value of the capacitor 1513 is $a^2:a:1$. Here, an adjustment is made so that the value of a equals a predetermined value smaller than 1. That is, the value of a is previously designed so as to provide an amount of phase delay equal to the amount of delay of the phase of the receive signal outputted from the output terminal P2 relative to the phase of the receive signal inputted from the input terminal P1 in the case of high gain mode. The value of a is determined in the same way as the method of the determining the value of a described in the third embodiment except that the resistor is replaced by the inductor. Because the inductor is used instead of the resistor of the third embodiment, the level of passing loss is reduced compared to the third embodiment.

Thus, by passing through this circuit portion, a receive signal of which amount of phase delay is substantially equal to the amount of delay of the passing phase in the case of high gain mode is outputted from the output terminal P2.

In this way, even if the passing phase of the receive signal in the case of high gain mode is delayed, and the input impedance of the portion corresponding to the amplifier 13 is larger than the output impedance of the same portion, it is possible to sufficiently alleviate the situation in which the phase of the signal outputted from the output terminal P2 is shifted in a discontinuous manner when switching is done from the high gain mode to the low gain mode, or from the low gain mode to the high gain mode.

Furthermore, the variable gain amplifying apparatus 44 of this embodiment may have a configuration in which the switching elements 121, 122, 123 take on 0 potentials at least at one ends as in the case of the variable gain amplifying apparatus 30 of the third embodiment. Thereby, the switching elements are reliably enabled/disabled, and the insertion loss when the switching elements are enabled is improved.

Furthermore, the variable gain amplifying apparatus 44 of this embodiment may also be constituted by balanced circuits as described in this embodiment.

Seventh Embodiment

The seventh embodiment will now be described.

Figure 27:
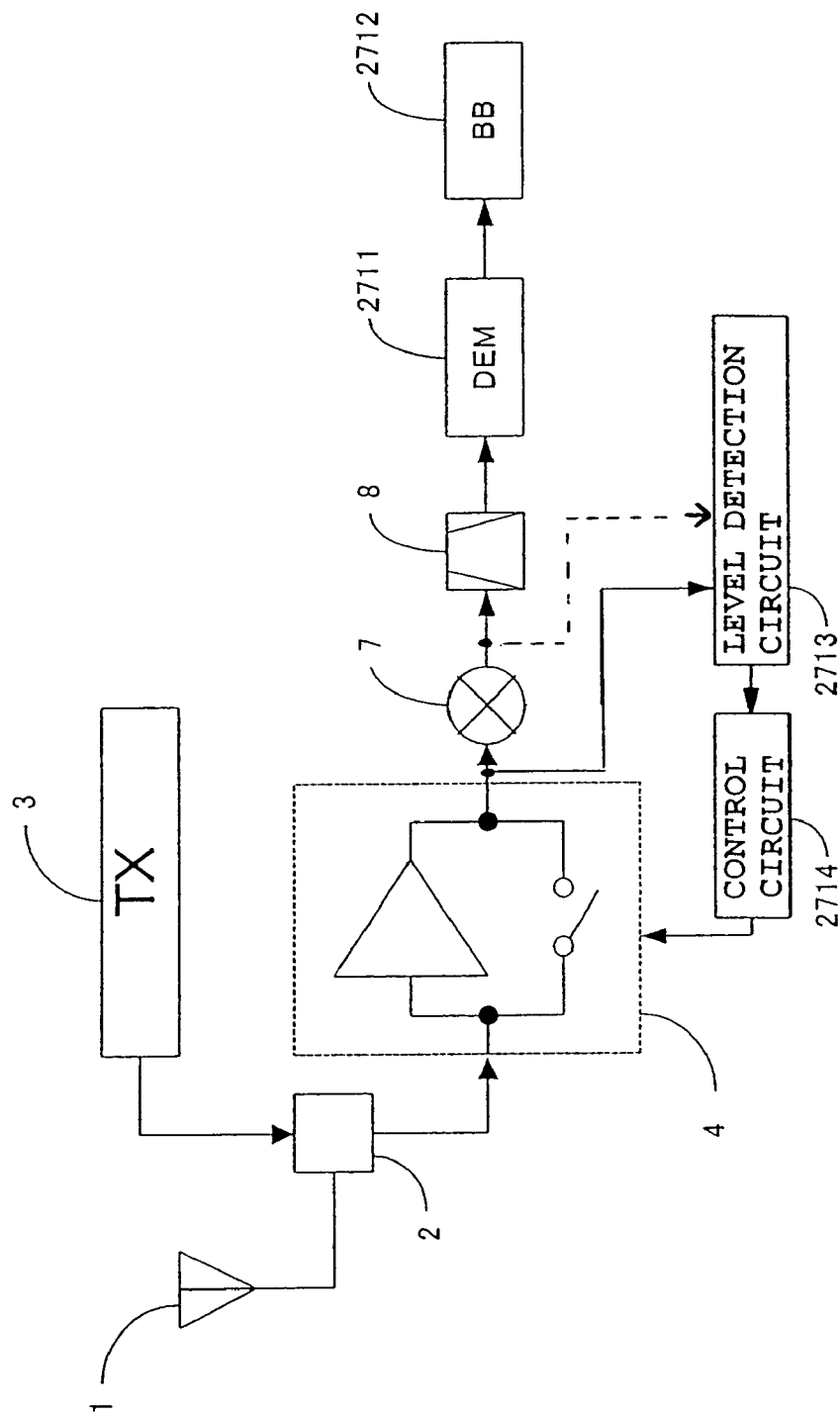
FIG. 27 is a block diagram showing the configuration of a wireless communication apparatus in the seventh embodiment of the present invention.

A wireless communication apparatus of this embodiment is shown in FIG. 27. In this figure, a cellular phone terminal is constituted by an antenna 1, a duplexer 2, a transmission circuit portion 3, a variable gain amplifying apparatus 4, a mixer 7, a filter 8, a demodulator 2711, a base band signal processing circuit 2712, a signal level detection circuit 2713 and a control circuit 2714. The variable gain amplifying apparatus 4, the mixer 7, the filter 8, the demodulator 2711 and the base band signal processing circuit 2712 constitute a reception circuit portion.

The antenna 1, the duplexer 2, the transmission circuit portion 3, the variable gain amplifying apparatus 4, the mixer 7 and the filter 8 are not described here because they are same as those of the prior art. The demodulator 2711 is a circuit to demodulate a base band signal from the signal outputted from the filter 8. The base band signal processing circuit 2712 is a circuit to process the demodulated signal as digital data. The signal level detection circuit 2713 is a circuit to detect the signal level of the input or output of the mixer 7. The control circuit 2714 is a circuit to switch the variable gain amplifying apparatus 4 to the high gain mode or low gain mode depending on the level of the signal level detection circuit 2713.

The variable gain amplifying apparatus 4 is identical to the variable gain amplifying apparatuses of the first to sixth embodiments of the present invention.

The operation of the wireless communication apparatus of this embodiment will now be described.

The receive signal received at the antenna 1 is amplified by the variable gain amplifying apparatus 4 through the duplexer 2. The mixer 7 converts the receive signal amplified by the variable gain amplifying apparatus 4 into an intermediate frequency signal, and the filter 8 weakens the unnecessary frequency component of the converted intermediate frequency signal. The demodulator 2711 converts the intermediate frequency signal into a base band signal of IQ, and the base band signal processing circuit 2712 restores the base band signal to digital voice data in a base band portion.

The signal level detection circuit 2713 detects the signal level of the input or output of the mixer 7. The control circuit 2714 receives the level detection signal from the signal level detection circuit 2713, and performs control so that the supply of a power voltage for operating the amplifier of the variable gain amplifying apparatus 4 is stopped, and the switching element of the variable gain amplifying apparatus 4 is enabled when it is determined that the level of receive signal is high. Thus, the large receive signal inputted from the duplexer 2 is outputted to the mixer 7 through the switching element of the variable gain amplifying apparatus 4 without being amplified by the amplifier of the variable gain amplifying apparatus 4. That is, the variable gain amplifying apparatus 4 operates in the low gain mode.

When it is determined that the level of receive signal is low, on the other hand, control is performed so that a power voltage for operating the amplifier of the variable gain amplifying apparatus 4, and the switching element of the variable gain amplifying apparatus 4 is disabled. Thus, the very weak signal inputted from the duplexer 2 is amplified by the amplifier of the variable gain amplifying apparatus 4 and then outputted to the mixer 7 without being passed through the switching element of the variable gain amplifying apparatus 4. That is, the variable gain amplifying apparatus 4 operates in the high gain mode.

In this case, by using any of the variable gain amplifying apparatuses of the first to seventh embodiments of the present invention, a wireless communication apparatus can be achieved in which the phase of the signal outputted from the variable gain amplifying apparatus 4 is not shifted in a discontinuous manner when the variable gain amplifying apparatus 4 is switched from the low gain mode to the high gain mode, or from the high gain mode to the low gain mode, thus making it possible to carry out normal demodulation of the signal with its phase modulated.

Also, there is an advantage that a response to change in signal level is made more quickly compared to the case where the signal level detection circuit is connected to some point behind the IF filter.

Figure 28:
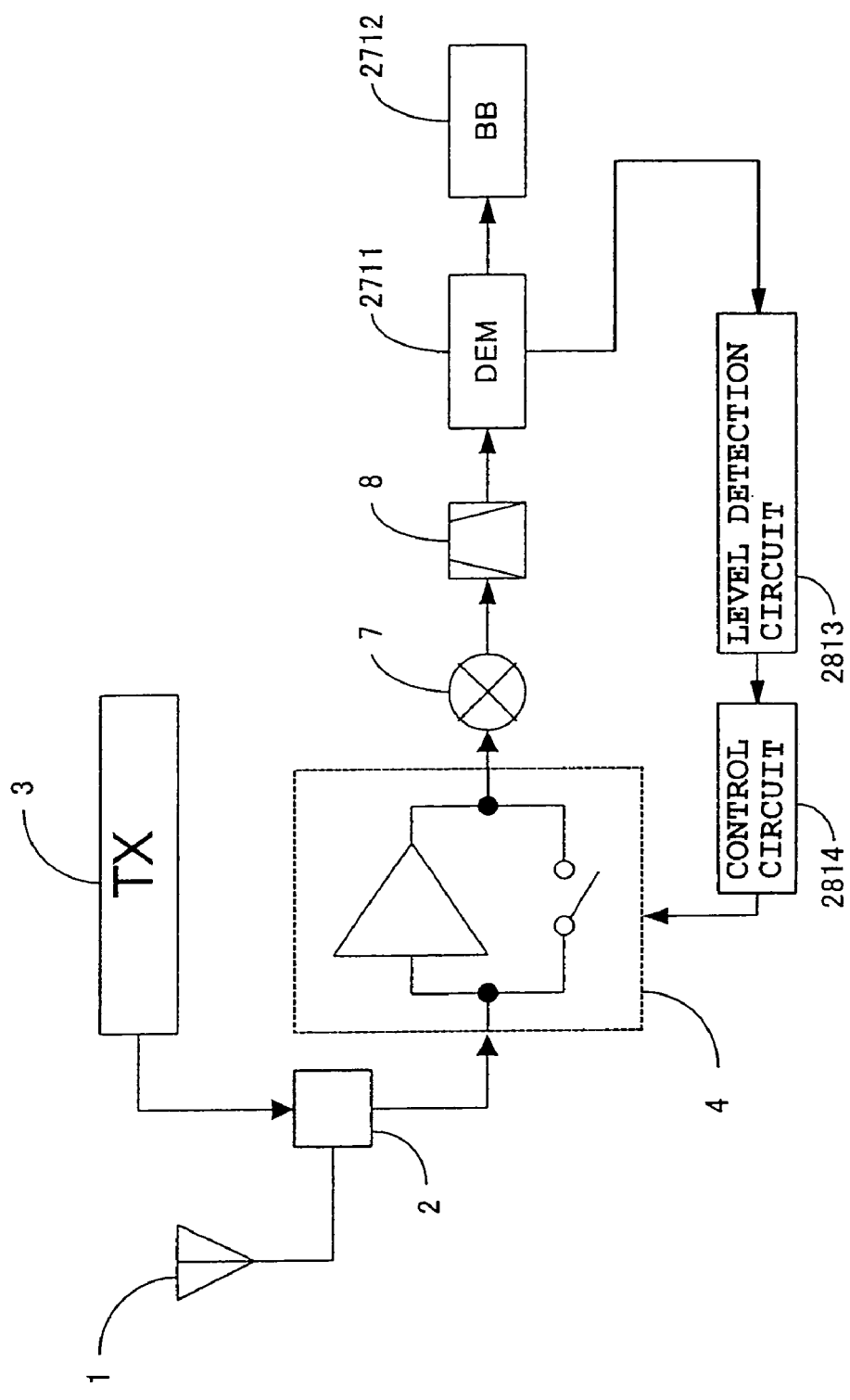
FIG. 28 is a block diagram showing the configuration of the wireless communication apparatus in the seventh embodiment of the present invention.

Furthermore, level detection is carried but by the input or output of the mixer 7 in FIG. 27, but level detection may be carried out by the demodulator 2711 as shown in FIG. 28. In the case where the input or output of the mixer 7 is used for level detection, a desired wave cannot be distinguished from a disturbing wave when both the desired wave and disturbing wave are received. Therefore, the wireless communication apparatus of FIG. 27 raises the possibility that although the level of desired wave is low, the gain mode is switched to the low gain mode in response to the high level of disturbing wave, and thus the desired wave is buried in noise and cannot be received in an appropriate manner. For the configuration of FIG. 28, on the other hand, since level detection is carried out in the demodulator 2711 occupying the rear stage of the IF filter, the gain mode is switched according to the level of desired wave, and thus the above problem is solved.

Figure 29:
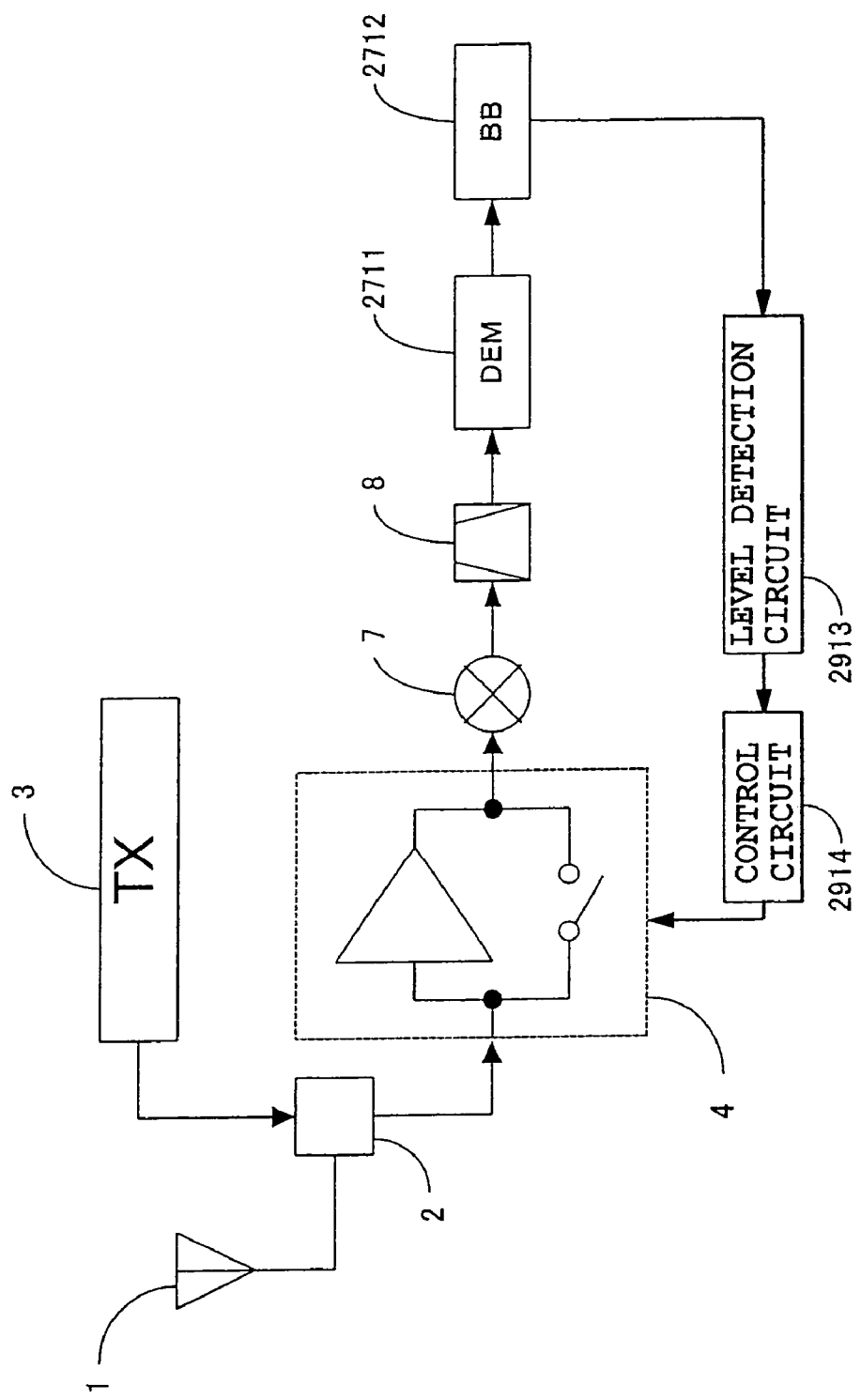
FIG. 29 is a block diagram showing the configuration of the wireless communication apparatus in the seventh embodiment of the present invention.

Level detection may be carried out digitally in the base band processing circuit 2712 as shown in FIG. 29. This configuration provides a same degree of effectiveness as the configuration of FIG. 28 and allows digital processing to be performed, thus making it possible to carry out level detection more easily.

Figure 30:
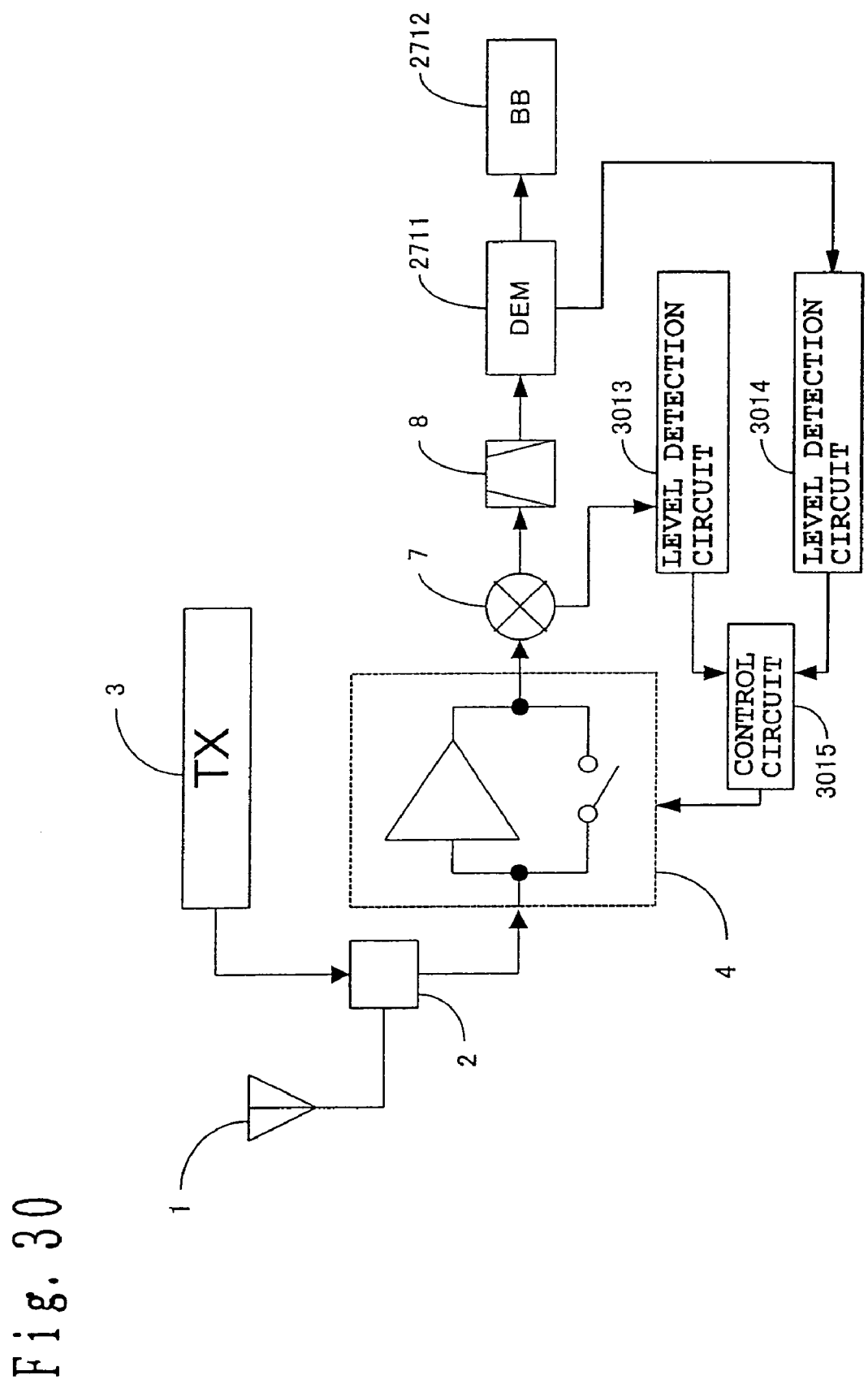
FIG. 30 is a block diagram showing the configuration of the wireless communication apparatus in the seventh embodiment of the present invention.

Furthermore, as shown in FIG. 30, level detection may be carried out using the input or output of the mixer 7 and the demodulator 2711 in combination. For the systems of FIGS. 28 and 29, the gain mode is not switched to the low gain mode when the level of desired wave is low and the level of disturbing wave is high, and therefore the desired wave can usually be received in an appropriate manner. If a much larger disturbing wave comes in, however, the amplifier of the variable gain amplifying apparatus 4 is saturated to cause reduction in gain and deterioration of noise indexes, thus raising the possibility that the desired wave cannot be received in an appropriate manner. For the configuration of FIG. 30, on the other hand, the total level of desired wave and disturbing wave is detected by the mixer 7, and the level of desired wave is detected by the demodulator 2711. Thereby, the level of desired wave and the level of disturbing wave can be known individually. At this time, if the level of desired wave is equal to or lower than a certain level, and the level of disturbing wave is equal to or higher than a certain level, the above problem is resolved by increasing the current consumption of the amplifier.

Furthermore, the level of receive signal is detected in the front and rear stages of the IF filter in FIG. 30, but a same degree of effectiveness will be attained if the level of receive signal is detected in the front and rear stages of the base band filter.

As apparent from the above description, the present invention can provide a variable gain amplifying apparatus capable of sufficiently alleviating the situation in which the phase outputted from the variable gain amplifying apparatus is shifted in a discontinuous manner even when the gain of the variable gain amplifying apparatus is switched, and a wireless communication apparatus.

What is claimed is:

1. A wireless communication apparatus comprising:
   a variable gain amplifying apparatus;
   a level detection circuit detecting the level of a receive signal in the rear of said variable gain amplifying apparatus; and
   a control circuit switching the gain of said variable gain amplifying apparatus,
   wherein said variable gain amplifying apparatus comprises:
   an amplifier directly connected between input and output terminals;
   one or more first switching elements connected in parallel to said amplifier; and
   a phase shifter connected in series to said first switching element, said series connected phase shifter and first switching element directly connected between the input and output terminals, said phase shifter comprised of multi-stage circuits using passive elements, an impedance of a passive element of each stage circuit monotonically increasing or monotonically decreasing from an input port to an output port of said phase shifter,
   wherein said first switching element is enabled if the level of an input signal or an output signal is higher than a predetermined level, and said first switching element is disabled if the level of said input signal or said output signal is equal to or lower than said predetermined level,
   said amplifier does not operate when said first switching element is enabled connecting said first switching element and said phase shifter in a closed circuit, the closed circuit in parallel with said amplifier, and said amplifier operates when said first switching element is disabled, and
   the amount of phase shift when said input signal is passed through said amplifier is substantially equal to the amount of phase shift when said input signal is passed through said first switching element and phase shifter, wherein said variable gain amplifying apparatus is switched to a low gain state if the level detected by said level detection circuit is higher than a predetermined level, and said variable gain amplifying apparatus is switched to a high gain state if the level detected by said level detection circuit is equal to or lower than said predetermined level.

2. A variable gain amplifying apparatus comprising:

an amplifier;

one or more first switching elements connected in parallel to said amplifier;

a phase shifter connected in series to said first switching element;

one or more second switching elements connected in parallel to said amplifier; and a feedback circuit connected in series to said second switching element, wherein said first switching element is enabled if the level of an input signal or an output signal is higher than a predetermined level, and said first switching element is disabled if the level of said input signal or said output signal is equal to or lower than said predetermined level, said amplifier does not operate when said first switching element is enabled, and said amplifier operates when said first switching element is disabled, said second switching element is disabled when said first switching element is enabled, said second switching element is enabled when said first switching element is disabled, and the amount of phase shift when said input signal is passed through said amplifier is substantially equal to the amount of phase shift when said input signal is passed through said first switching element and said phase shifter.

3. The wireless communication apparatus according to claim 1, wherein said first switching element is comprised of one or more third switching elements and one or more fourth switching elements, one end of said third switching element is connected to the input of said amplifier, the other end of said third switching element is connected to one end of said phase shifter, the other end of said phase shifter is connected to one end of said fourth switching element, and the other end of said fourth switching element is connected to the output of said amplifier.

4. The variable gain amplifying apparatus according to claim 2, wherein said first switching element is comprised of one or more third switching elements and one or more fourth switching elements, one end of said third switching element is connected to the input of said amplifier, the other end of said third switching element is connected to one end of said phase shifter, the other end of said phase shifter is connected to one end of said fourth switching element, and the other end of said fourth switching element is connected to the output of said amplifier.

5. The wireless communication apparatus according to claim 1 or 3, wherein each stage of said multistage circuits is comprised of one or more serial-connected capacitors and one or more parallel-connected resistors.

6. The wireless communication apparatus according to claim 1 or 3, and using phase modulation signals as send/receive signals.

7. A wireless communication apparatus comprising:

the variable gain amplifying apparatus according to claim 2 or 4;

a level detection circuit detecting the level of a receive signal in the rear of said variable gain amplifying apparatus; and a control circuit switching the gain of said variable gain amplifying apparatus, wherein said variable gain amplifying apparatus is switched to a low gain state if the level detected by said level detection circuit is higher than a predetermined level; and said variable gain amplifying apparatus is switched to a high gain state if the level detected by said level detection circuit is equal to or lower than said predetermined level.

8. A wireless communication apparatus comprising:

a variable gain amplifying apparatus;

a level detection circuit detecting the level of a receive signal in the rear of said variable gain amplifying apparatus; and a control circuit switching the gain of said variable gain amplifying apparatus, wherein said variable gain amplifying apparatus comprises:

an amplifier;

one or more first switching elements connected in parallel to said amplifier; and a phase shifter connected in series to said first switching element, said phase shifter comprised of multi-stage circuits using passive elements, an impedance of a passive element of each stage circuit monotonically increasing or monotonically decreasing from an input port to an output port of said phase shifter, wherein said first switching element is enabled if the level of an input signal or an output signal is higher than a predetermined level, and said first switching element is disabled if the level of said input signal or said output signal is equal to or lower than said predetermined level, said amplifier does not operate when said first switching element is enabled, and said amplifier operates when said first switching element is disabled, and the amount of phase shift when said input signal is passed through said amplifier is substantially equal to the amount of phase shift when said input signal is passed through said first switching element and phase shifter, wherein said variable gain amplifying apparatus is switched to a low gain state if the level detected by said level detection circuit is higher than a predetermined level, and wherein said variable gain amplifying apparatus is switched to a high gain state if the level detected by said level detection circuit is equal to or lower than said predetermined level.

9. The wireless communication apparatus according to claim 8, wherein said first switching element is comprised of one or more third switching elements and one or more fourth switching elements, one end of said third switching element is connected to the input of said amplifier, the other end of said third switching element is connected to one end of said phase shifter, the other end of said phase shifter is connected to one end of said fourth switching element, and the other end of said fourth switching element is connected to the output of said amplifier.

10. The wireless communication apparatus according to claim 8 or 9, wherein each stage of said multistage circuits is comprised of one or more serial-connected capacitors and one or more parallel-connected resistors.

11. The wireless communication apparatus according to claim 8 or 9, and using phase modulation signals as send/receive signals.

12. The variable gain amplifying apparatus according to claim 2 or 4, wherein said phase shifter is comprised of one or more serial-connected capacitors and one or more parallel-connected resistors.

13. A wireless communication apparatus comprising the variable gain amplifying apparatus according to claim 2 or 4, and using phase modulation signals as send/receive signals.

* * * * *